United States Patent [19]
Phillips et al.

[11] Patent Number: 5,732,107
[45] Date of Patent: Mar. 24, 1998

[54] FIR INTERPOLATOR WITH ZERO ORDER HOLD AND FIR-SPLINE INTERPOLATION COMBINATION

[75] Inventors: William C. Phillips, Ellicott City; Michael V. Pascale, Millersville, both of Md.

[73] Assignee: Northrop Grumman Corporation, Los Angeles, Calif.

[21] Appl. No.: 522,049

[22] Filed: Aug. 31, 1995

[51] Int. Cl.$^6$ ............................................. H04K 1/02
[52] U.S. Cl. .................. 375/296; 375/229; 375/350; 364/724.1; 364/724.16
[58] Field of Search ................................ 375/229, 261, 375/268, 285, 295, 296, 298, 300, 350; 364/577, 723, 724.1, 853, 724.16; 341/122–125

[56] References Cited

U.S. PATENT DOCUMENTS

| | | |
|---|---|---|
| 5,182,559 | 1/1993 | Tokuyama . |
| 5,461,604 | 10/1995 | Hasegawa ........................ 369/124 |
| 5,592,517 | 1/1997 | Camp et al. ...................... 375/350 |

FOREIGN PATENT DOCUMENTS 497060  8/1992  European Pat. Off. .

OTHER PUBLICATIONS

Pai, H.W. "Fir compensation filter for the zero order hold D/A converter using the frequency sampling method", Proceedings of the 37th Midwest Symposium on Circuits and Systems, IEEE 1994, pp. 1006–1009 Aug. 1994.

"Advanced Engineering Mathematics", Fourth Edition, Erwin Kreyszig, John Wiley & Sons, 1992, Ch. 19, pp. 774–777.

*Primary Examiner*—Stephen Chin
*Assistant Examiner*—Amanda T. Le
*Attorney, Agent, or Firm*—Walter G. Sutcliff

[57] ABSTRACT

A FIR interpolator which uses a zero order hold to add samples in-between original samples of a digital input stream. The use of zero order hold with a FIR interpolator reduces output harmonics as compared to the use of conventional zero fill. Moreover, a computation method has been developed to greatly reduce the amount of computation needed by combining the zero order hold and the FIR filter. The output of the FIR interpolator can then be interpolated by a Spline interpolator to further interpolate the input stream. The combination of zero order hold FIR interpolation with Spline interpolation provides an efficient, cost effective technique of interpolating a digital input stream while producing relatively small output harmonics.

21 Claims, 8 Drawing Sheets

FIG.3
*PRIOR ART*
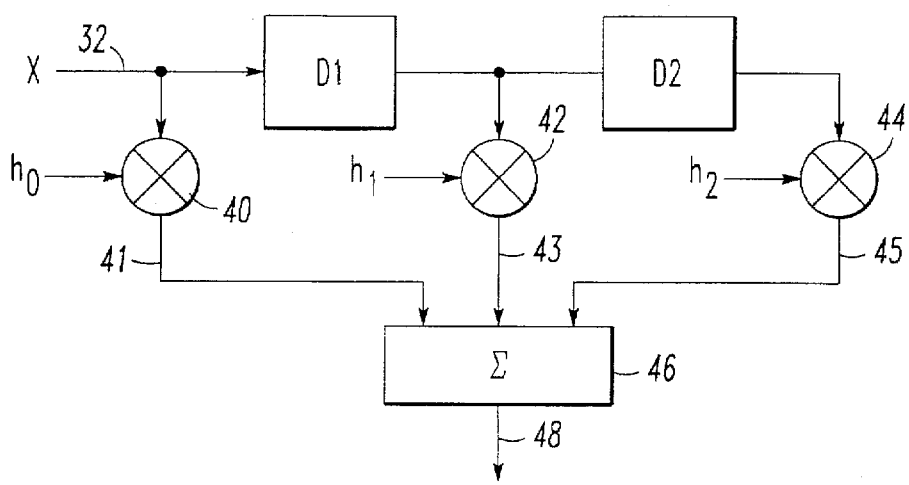
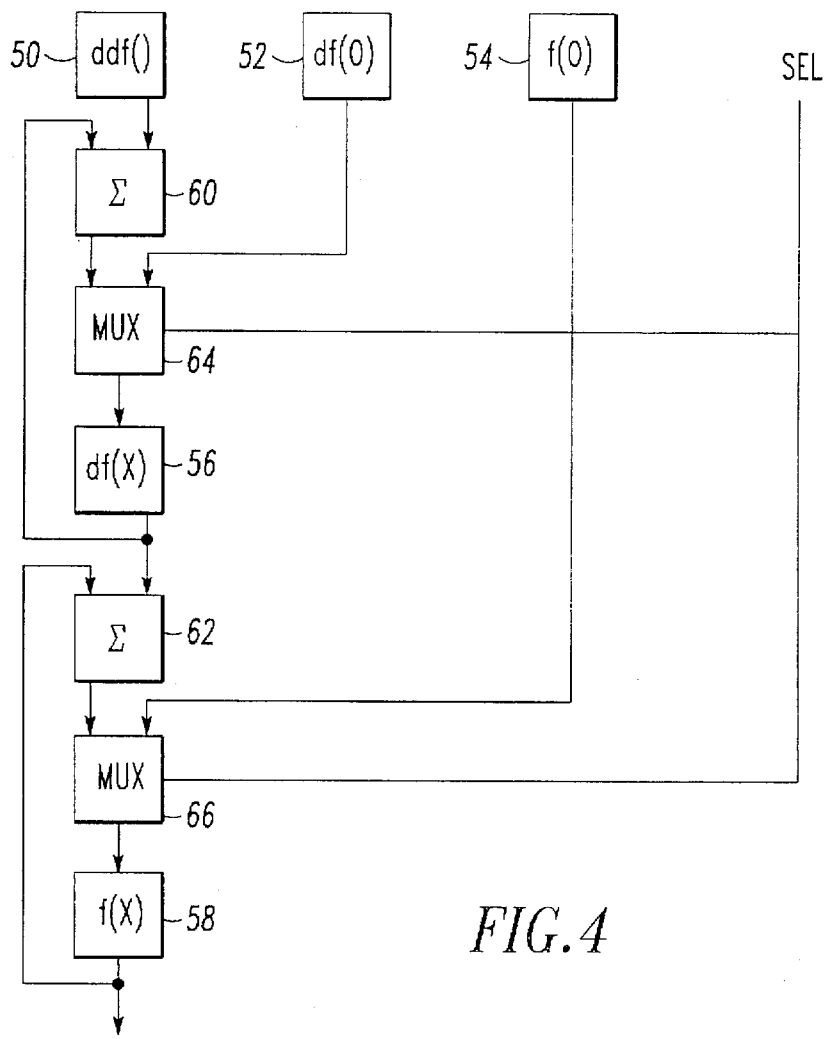
*FIG.4*

FIR INTERPOLATOR WITH ZERO ORDER HOLD AND FIR-SPLINE INTERPOLATION COMBINATION

CROSS REFERENCE TO RELATED APPLICATIONS

This application is related to U.S. Applications entitled DIGITALLY PROGRAMMABLE MULTIFUNCTION RADIO SYSTEM ARCHITECTURE, having U.S. Ser. No. 08/522,050. COMMON RECEIVE MODULE FOR A PROGRAMMABLE DIGITAL RADIO, having U.S. Ser. No. 08/528,206; COMMON TRANSMIT MODULE FOR A PROGRAMMABLE DIGITAL RADIO, having U.S. Ser. No. 08/522,058; DIGITALLY PROGRAMMABLE RADIO MODULES FOR TRANSPONDER SYSTEMS, having U.S. Ser. No. 08/522,059 and and WIDE BAND RADIO-FREQUENCY CONVERTER HAVING MULTIPLE USE OF INTERMEDIATE FREQUENCY TRANSLATORS, having U.S. Ser. No. 08/322,513, now U.S. Pat. No. 5,548, 839 which are incorporated by reference herein.

BACKGROUND OF THE INVENTION

1. Field of the Invention

The present invention relates to interpolation of samples and, more particularly, to the use of FIR interpolation combined with Spline interpolation.

2. Description of the Background Art

A stream of digital samples must be "smoothed" or "interpolated" to approximate a curve. An interpolator is used to perform such "smoothing" or "interpolation". An interpolator receives an input stream of samples and calculates sample estimates in-between the samples of the input stream. In other words, for each sample input to the interpolator, m samples are output, where m is an integer greater than one. Therefore, if the input sample rate is $\omega_{IN}$, the output sample rate is $\omega_{OUT} = m\omega_{IN}$.

Finite Input Response (FIR) interpolation is a conventional form of interpolation which includes two parts: (a) a sample rate expander (or simply an "expander") that adds samples in-between samples of the input stream, thereby producing an output stream having an increased sample rate, and (b) a FIR filter that filters the increased sample rate output stream to produce a smooth output stream with the harmonics produced by the expander being attenuated.

Generally, conventional FIR interpolators use a well-known "zero fill" technique as the expander to add samples in-between the original samples of the input stream. Therefore, for example, seven new samples would be added in-between original samples of the input stream to increase the sample rate by a factor of eight. With zero fill, the new samples have a zero amplitude. As is well-known, the use of zero fill increases the computational efficiency in the FIR filter by not multiplying the zero points by the filter coefficients. After expanding the input stream, a FIR interpolator uses a FIR filter to filter the sampled input stream and produce a smooth curve.

Unfortunately, a conventional FIR interpolator using a conventional zero fill technique can cause relatively large sampling harmonics. As a result, a FIR interpolator using zero fill must have a high attenuation FIR filter, resulting in increased computation, to be used in applications which require relatively small sampling harmonics. For example, digital transmitters typically receive a digital input stream, interpolate the input stream and then transmit a radio frequency (RF) signal containing information from the digital input stream. A FIR interpolator with zero fill expansion can effectively be used with such a digital transmitter only if the FIR filter performance reduces sampling harmonics to levels that will not cause interference with other RF frequency bands.

Instead of a FIR interpolator with zero fill, a Spline interpolator can be used to interpolate a digital input stream. However, Spline interpolation is a non-linear function, thereby creating relatively large harmonics. Therefore, a Spline interpolator cannot generally be used in applications which require relatively small sampling harmonics. As a result, Spline interpolators are not used in digital transmitters to interpolate a digital input stream.

SUMMARY OF THE INVENTION

It is therefore an object of the present invention to provide a FIR interpolator which uses a zero order hold technique instead of a zero fill technique to interpolate the input stream, thereby reducing sampling harmonics and performance requirements of a FIR filter without any additional computation.

It is also an object of the present invention to provide a combination of FIR interpolation and Spline interpolation to interpolate digital signals, thereby greatly reducing sampling harmonics. The combination uses a FIR interpolator to interpolate an input stream, and a Spline interpolator to interpolate the output of the FIR interpolator.

It is a further object of the present invention to provide an interpolator which can effectively be used with a digital transmitter.

Objects of the present invention are achieved by providing a method of interpolating an input stream of original samples. The method includes the steps of (a) adding new samples in-between the original samples, referred to as "expanding", by using zero order hold (ZOH); and (b) FIR filtering the increased sample rate stream. Adding new samples with zero order hold (ZOH) increases the sample rate of the input stream by adding new samples at the amplitude of the immediately preceding original sample.

Objects of the present invention are also achieved by providing a method of interpolating an input stream of original samples, in which the method comprises the steps of (a) increasing the sample rate of the input stream, or expanding, by adding new samples in-between the original samples to produce an increased sample rate stream, the new samples being added at the amplitude of the immediately preceding original sample; (b) low pass FIR filtering the increased sample rate stream; and (c) Spline interpolating the output of the FIR filter to further increase the sample rate.

Moreover, objects of the present invention are achieved by combining the steps of increasing the sample rate and FIR filtering by filtering the input stream $m_f$ times for each original sample, each time using a different set of $m_f$ sets of coefficients satisfying the following equations:

$$c_k = \begin{cases} \sum_{j=0}^{l\%m_f} c_j & k=0 \\ \sum_{j=l\%m_f+(k-1)m_f+1}^{l\%m_f+km_f} c_j & 1 \leq k \leq n-1, \text{ then} \\ \sum_{j=l\%m_f+(n-1)m_f}^{nm_f} c_j & k=n \end{cases}$$

-continued $$xf_i = \sum_{k=0}^{n} c_{kl} xb_{\left\lfloor \frac{i}{m_f} \right\rfloor - k} \quad \text{where } 1 = i\%m_f$$

where $xf_i$ equals the output sequence of the filtering and is described mathematically in terms of a baseband input sequence $xb_i$ and coefficients $C_{kl}$, and $m_f$ equals the interpolation factor, thereby producing an increased sample rate stream having $m_f$ output samples for each original sample of the input stream. Also, % represents the modulus operator.

Objects of the present invention are further achieved by providing a radio transmitter which transmits an input stream of original samples representing digitized data. The radio transmitter includes a digital signal processor which increases the sample rate of the input stream by adding new samples in-between the original samples to produce an increased sample rate stream, the new samples being added at the amplitude of the immediately preceding original sample. The digital signal processor also low pass FIR filters the increased sample rate stream to produce an interpolated signal with small harmonics. A Spline interpolator, connected to the FIR filter, receives the FIR filtered signal, and produces data at a sample rate having an additional factor greater than the FIR output signal. A modulator receives the FIR-Spline interpolated signal and produces a digitally modulated carrier signal.

BRIEF DESCRIPTION OF THE DRAWINGS

These and other objects and advantages of the invention will become apparent and more readily appreciated from the following description of the preferred embodiments, taken in conjunction with the accompanying drawings, of which:

FIG. 3 (prior art) is a diagram illustrating a conventional FIR filter.

FIG. 4 is a block diagram of a quadratic Spline interpolator, according to an embodiment of the present invention.

DESCRIPTION OF THE PREFERRED EMBODIMENTS

As described above, an interpolator calculates sample estimates in between samples. In other words, for each sample input to the interpolator, m>1 samples are output. Therefore, if the input sample rate is $\omega_{IN}$, the output sample rate is $\omega_{OUT} = m\omega_{IN}$.

Figure 1:
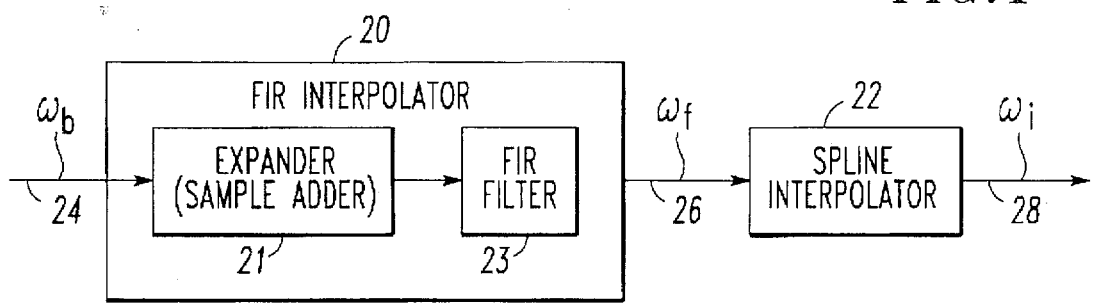
FIG. 1 is a block diagram illustrating a FIR interpolator in combination with a Spline interpolator, according to an embodiment of the present invention.

FIG. 1 is a block diagram illustrating a FIR interpolator 20 in combination with a Spline interpolator 22, according to an embodiment of the present invention. FIR interpolator 20 receives an input signal 24 representing input samples having an input sample rate of $w_b$. FIR interpolator 20 performs FIR interpolation on input signal 24 to produce a FIR interpolated signal 26 having a sample rate of $w_f$. FIR interpolated signal 26 is received by Spline interpolator 22. Spline interpolator 22 performs Spline interpolation on FIR interpolated signal 26, to produce a FIR-Spline interpolated signal 28 having a sample rate equal to $w_i$.

FIR Interpolation

FIR interpolation includes the steps of: (a) expanding, or "adding" samples to, the input stream, thereby producing an output stream having an increased sample rate, and (b) low pass FIR filtering the increasing sample rate output stream to produce a smooth output stream. Therefore, in FIG. 1, FIR interpolator 20 is illustrated as including an expander 21 which adds samples to the input stream, and a FIR filter 23 which filters the increased sample rate stream produced by expander 21.

1. Increasing the sample rate

Figure 2A:
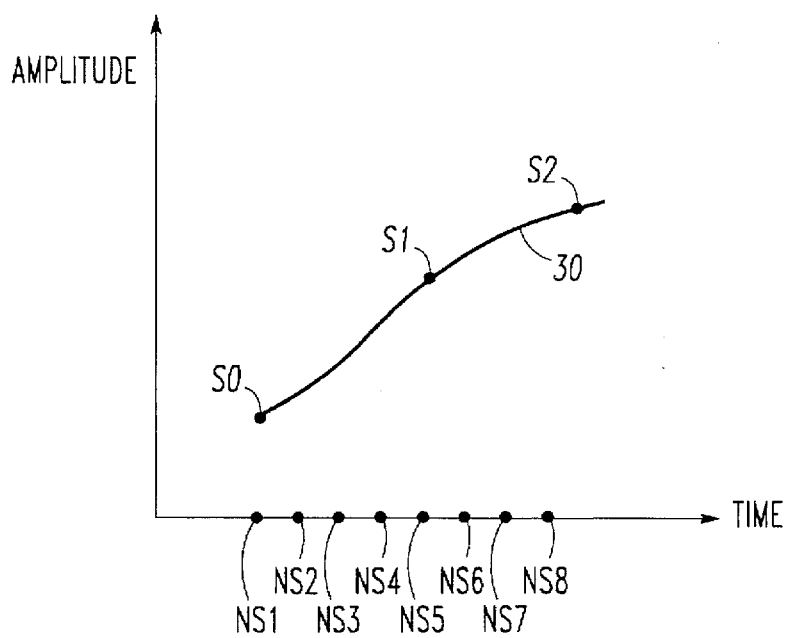
FIG. 2A (prior art) is a diagram illustrating a conventional zero fill technique for adding samples.

Generally, expander 21 of a conventional FIR interpolator uses a well-known "zero fill" technique where new samples are added between the samples of the input stream. Therefore, for example, seven new samples would be added between samples of the input stream to increase the sample rate by a factor of eight. The new samples have a zero amplitude. FIG. 2A illustrates, in general, a conventional zero fill technique where S0, S1 and S2 represent three different samples of the input signal. The input signal can be approximated by a curve 30. Four new samples NS1, NS2, NS3 and NS4 are added between original samples S0 and S1, and four new samples NS5, NS6, NS7 and NS8 are added between original samples S1 and S2, to increase the sample rate by a factor of five. NS1 through NS8 are added at a zero amplitude. A FIR filter, discussed later, receives S0, S1, S2, NS1, NS2, NS3, NS4, NS5, NS6, NS7 and NS8 and uses these samples to approximate curve 30. As is well-known, the use of zero fill eliminates the need for some computations (multiplies) that are needed in more general FIR filters. However, as previously discussed, the use of zero fill increases sampling harmonics.

Figure 2B:
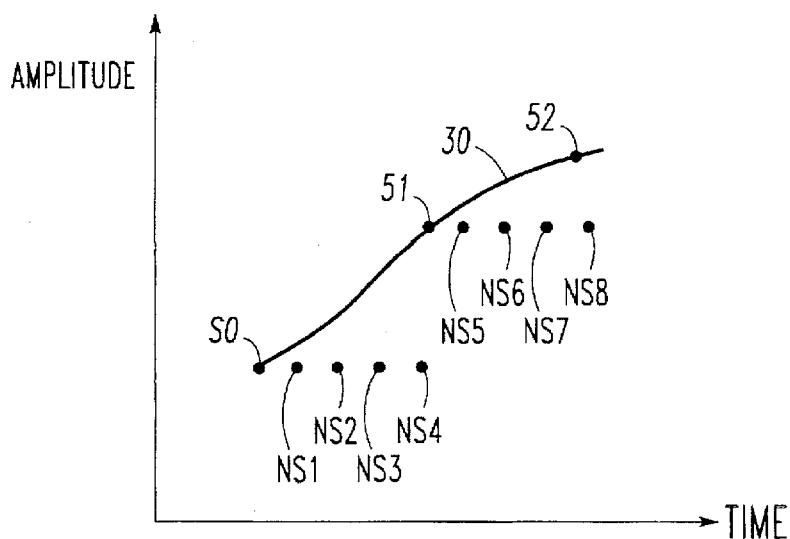
FIG. 2B is a diagram illustrating a zero order hold technique for adding samples, according to an embodiment of the present invention.

Therefore, a feature of the present invention is that the above-described zero fill technique is not used with FIR interpolation. Instead, according to the present invention, expander 21 of FIR interpolator 20 uses a "zero order hold" (ZOH) technique in which new samples are added between original input samples, but the new samples are added at the "height" or "amplitude" of the previous original input sample. Therefore, a zero order hold replicates the previous input sample for each new estimated sample. FIG. 2B illustrates the zero order hold technique, according to the present invention. As illustrated in FIG. 2B, new samples NS1 through NS4 are added between samples S0 and S1, and new samples NS5 through NS8 are added between samples S1 and S2, to increase the sample rate by a factor of five. However, NS1 through NS8 are added at the amplitude of the previous sample of the input stream by repeating the previous sample of the input stream. A FIR filter receives S0, S1, S2, NS1, NS2, NS3, NS4, NS5, NS6, NS7 and NS8 and uses these samples to approximate curve 30. The use of zero order hold in a FIR interpolator greatly reduces sampling harmonics, as compared to the use of zero fill in a FIR interpolator.

2. FIR filtering

A FIR filter smooths the output of the expander by low pass filtering the over sampled input stream. As described above, a FIR interpolator according to the present invention uses a zero order hold to insert additional samples. That is, expander 21 uses replication rather than zero filling. Each input sample of the input stream is replicated $m_f-1$ times and the total of $m_f$ samples (the original sample plus the $m_f-1$ replicated samples) are input to the low pass FIR filter. As compared to zero fill, zero order hold greatly reduces sampling harmonics. Therefore, filter stop band floor requirements of the FIR filter are reduced. In addition, as described later, the computational efficiency in the FIR filter of zero filling is not lost since the replication of data from the zero order hold is exploited. Filter parameters of an FIR filter include input sample rate $\omega_b$ (sample rate before additional samples are added by zero order hold), interpolated sample rate $\omega_f$ (sample rate of a signal after passing through the expander), pass band corner frequency $\omega_p$ of the FIR filter, stop band corner frequency of the FIR filter $\omega_s \leq B_b$, passband ripple of the FIR filter, and stopband attenuation of the FIR filter.

FIG. 3 illustrates a simplified example of a conventional FIR filter structure having delay elements D1 and D2 sequentially connected together. An input stream 32 is fed to the first delay element D1. A multiplier 40 receives the input stream 32 and a filtering coefficient $h_0$, and produces a corresponding multiplied output 41. A multiplier 42 receives the output of delay element D1 and a filtering coefficient $h_1$, and produces a corresponding multiplied output 43. Further, multiplier 44 receives the output of delay element D2 and a filtering coefficient $h_2$, and produces a corresponding multiplied output 45. Multipliers 40, 42 and 44 are commonly referred to as "taps". The multiplied outputs 41, 43 and 45 are fed to an adder 46 which combines the multiplied outputs 41, 43 and 45 to form a filtered signal 48. The number of delay elements, the number of taps and the values of filtering coefficients $h_0$, $h_1$ and $h_2$ are determined in accordance with the desired filter characteristics. When preceded by an expander, the FIR filter output (filtered signal 48) is the interpolated signal.

Filter design is typically done with the aid of a computer program. The Parks-McClellan FIR filter design algorithm is the methodology adopted herein. Filters designed using this technique are optimum in the sense that the maximum error between the desired frequency response and the actual frequency response is minimized. Filters designed this way exhibit an equiripple behavior in their frequency responses, and hence are sometimes called equiripple filters. The number of taps (coefficients) used to implement a FIR filter will determine the magnitude of the error between the desired and actual frequency responses.

The number of taps in a FIR filter necessary to achieve a prescribed performance can be approximated by $$taps = \frac{D_\infty(\delta_p,\delta_s)}{(\omega_s-\omega_p)/(2\pi)} - f(\delta_p,\delta_s)\frac{\omega_s-\omega_p}{2\pi}+1$$

where $B_t=(\omega_s-\omega_p)/\omega_f$=transition band, $D_\infty(\delta_p,\delta_s)=\log_{10}\delta_s \cdot [0.00539(\log_{10}\delta_p)^2+0.07114 \log_{10}\delta_p-0.4761]$,
$+[-0.00266(\log_{10}\delta_p)^2-0.5941 \log_{10}\delta_p-0.4278]$, and $f(\delta_p,\delta_s)=11.012+0.512 (\log_{10}\delta_p-\log_{10}\delta_s)$ with $\delta_s \leq \delta_p$, wherein taps=number of FIR filter taps $\delta_p$=ripple (deviation) in the passband from the ideal response ratio $\delta_s$=ripple (deviation) in the stopband from the ideal response (ratio)

$\omega_p$=passband edge frequency (rad)

$\omega_s$=stopband edge frequency (rad)

A simpler approximation is given by taps=$\Delta_s/(k \cdot B_t)$ where $\Delta_s=20 \cdot \log_{10}(\delta_s)$, $\Delta_p=20 \cdot \log_{10}(\delta_p)$, and constant k is given in the table below.

| | k where taps ≈ $\Delta_s/(k \cdot B_t)$ | | |
|---|---|---|---|
| | $\Delta_p$ (dB) | | |
| $\Delta_s$ (dB) | 0.5 | 1.0 | 2.0 |
| 30 | 13.1 | 16.1 | 21.1 |
| 40 | 14.0 | 16.6 | 20.6 |
| 50 | 14.7 | 17.0 | 20.4 |
| 60 | 15.1 | 17.3 | 20.2 |
| 70 | 15.5 | 17.4 | 20.1 |

The number of taps of the FIR filter will also determine the amount of work required to implement the FIR filter. The work required to implement a FIR filter is typically one add and one multiply per tap per filter output.

As described above, the use of zero order hold adds samples at the amplitude of the input samples, or repeats the input data. The work to implement the zero order hold expander and FIR filter combination can be reduced by exploiting this repetition of input data. Input samples are repeated $m_f=\omega_f/\omega_b$ times. The FIR filter input sequence $xu_i$ can be described mathematically in terms of the baseband input sequence $xb_i$ of the input stream as $xu_i = xb_{\lfloor i/m_f \rfloor}$. Thus the calculation of the FIR output sequence $xf_i$ reduces as follows, $$xf_i = \sum_{j=0}^{taps-1} c_j xu_{i-j}$$

Assume taps=$nm_f+1$. It will become apparent through this development that a filter with taps=$nm_f+1$, where n is the smallest integer such that $(nm_f+1) \geq taps_{min}$, can be implemented with the same computational complexity as a filter with n taps. The quantity $taps_{min}$ is the minimum number of taps needed in a FIR filter at the $w_f$ sample rate to reduce harmonics to the required levels.

$$xf_i = \sum_{j=0}^{nm_f} c_j xu_{i-j}$$
$$= \sum_{j=0}^{nm_f} c_j xb_{\lfloor \frac{i-j}{m_f} \rfloor}$$

Substitute $i=\lfloor i/m_f \rfloor+i\%m$, wherein % represents the modulus operator.

$$xf_i = \sum_{j=0}^{m_f n} c_j x b \left\lfloor \frac{i}{m_f} \right\rfloor_{-\left\lfloor \frac{i\%m_f - j}{m_f} \right\rfloor}$$

$$= xb\left\lfloor \frac{i}{m_f} \right\rfloor \cdot \sum_{j=0}^{i\%m_f} c_j + xb\left\lfloor \frac{i}{m_f} \right\rfloor_{-1} \cdot \sum_{j=i\%m_f+1}^{i\%m_f+m_f} c_j + xb\left\lfloor \frac{i}{m_f} \right\rfloor_{-1} \cdot$$

$$\sum_{j=i\%m_f+m_f+1}^{i\%m_f+2m_f} + \ldots + xb\left\lfloor \frac{i}{m_f} \right\rfloor_{-(n-1)} \cdot \sum_{j=i\%m_f+(n-2)m_f+1}^{i\%m_f+(n-1)m_f} c_j +$$

$$xb\left\lfloor \frac{i}{m_f} \right\rfloor_{-n} \cdot \sum_{j=i\%m_f+(n-1)m_f+1}^{n m_f}$$

For $l=0, 1, \ldots m_f-1$, let $$c_{kl} = \begin{cases} \sum_{j=0}^{l\%m_f} c_j & k=0 \\ \sum_{j=l\%m_f+(k-1)m_f+1}^{l\%m_f+km_f} c_j & 1 \leq k \leq n-1, \\ \sum_{j=l\%m_f+(n-1)m_f}^{nm_f} c_j & k=n \end{cases}$$

$$xf_i = \sum_{k=0}^{n} c_{kl} xb \left\lfloor \frac{i}{m_f} \right\rfloor_{-k} \text{ where } 1 = i\%m_f$$

The amount of computation needed to compute $xf_i$ equals:

$$n \frac{\text{adds and multiplies}}{\text{FIR output}} = \left\lceil \frac{\text{taps} - 1}{m_f} \right\rceil \frac{\text{adds and multiplies}}{\text{FIR output}}$$

Thus, there are $m_f$ sets of n coefficients that are applied to the most recent baseband samples, thereby creating $m_f$ outputs for each new baseband sample that becomes available. This is a key result. By taking advantage of replication and prior knowledge of the coefficients, the amount of computations needed to implement the FIR filter is reduced by a factor of $m_f$. The zero order hold expansion is embedded in the $m_f$ sets of coefficients. For each input sample to the interpolator, $m_f$ samples are output. Each sample output is generated by using a different set of coefficients in a FIR filter operating on the baseband samples.

Therefore, according to the present invention, FIR interpolation includes the steps of (a) increasing the sample rate of an input stream by adding new samples in-between the original samples to produce an increased sample rate stream, the new samples being added at the amplitude of the immediately preceding original sample; and (b) FIR filtering the increased sample rate stream. Moreover, according to the present invention, $m_f$ sets of coefficients are created. Thus, according to the present invention, the steps of increasing the sample rate and FIR filtering are combined by filtering the input data stream of original samples $m_f$ times, each time using a different set of the $m_f$ sets of coefficients.

More specifically, each time an input sample is received, $m_f$ output samples are generated by FIR filtering once with each of the $m_f$ sets of coefficients, thereby producing $m_f$ output samples for each input sample. This process is equivalent to a two-step procedure of adding $m_f$ samples and then FIR filtering with a $(nm_f+1)$ tap FIR filter. This new method uses n adds and n multiplies per output point $xf_i$, while the conventional methods require $(nm_f+1)$ adds and $(nm_f+1)$ multiplies per output point.

Spline Interpolation

The above description illustrates FIR interpolation. However, there are other types of interpolation, including conventional Spline interpolation. Quadratic spline interpolation offers the advantage of a very efficient, and fast computational structure. The cost of interpolating a signal at a very high sample rate with a quadratic spline interpolator is much less than the cost of a FIR interpolator. Each output can be generated with only two additions. Spline interpolation is a non-linear function, thereby creating sampling harmonics. As a result of the sampling harmonics, Spline interpolation has not been used in conventional radio communication systems.

However, according to the present invention, a Spline interpolator is used after FIR interpolation with zero order hold (see FIG. 1). Therefore, according to the present invention, sampling harmonics are smoothed out with FIR interpolation using zero order hold. Then, the smoothed out signal is further interpolated by a Spline interpolator. By smoothing out the signal before Spline interpolation, a FIR-Spline combination works well and produces relatively small sampling harmonics. The Spline interpolator works well because the input to the Spline interpolator is sampled at a rate several times the Nyquist rate. This "oversampling" limits the deviation from sample to sample at the input to the Spline interpolator, and as a result, the Spline interpolator does not generate excessive harmonics (or spurs) at the output. Therefore, according to the present invention, a FIR-Spline combination can be used in a transmitter for transmitting radio frequency signals.

Spline interpolation can use linear, quadratic, or other such forms of interpolation.

1. Linear Interpolation

A linear interpolator (such as a linear Spline interpolator) uses a first order polynomial (straight line) to interpolate between samples. Thus, coefficients for the line $f(x)=bx+c$ are determined from two samples, $y_1$ and $y_2$. Then, these coefficients are used to calculate the value of samples added between $y_1$ and $y_2$.

However, interpolators based directly on the straight line $f(x)=bx+c$ equation tend to be complex. Therefore, the following simplified equations represent linear interpolation from 1 to $m_i$ samples, for implementing a linear interpolator. If $m_i$ is large, the amount of work required to evaluate each interpolation is approximately 1 add/point.

$$f(0)=y_1$$

$$df( )=b$$

$$f(x)=f(x-1)+df( ) x=1, \ldots, m_i-1$$

where $$b=(y_2-y_1)/m_i$$

With linear spline interpolation, harmonics are located relative to the fundamental(s) of the sinusiod(s), $\omega_0$, which comprise the signal and are at $\omega_f-\omega_0$ with amplitude $-40 \cdot \log_{10}(\omega_f/\omega_0-1)$.

2. Quadratic Interpolation

A quadratic interpolator (such as a quadratic spline interpolator) uses a second order polynomial to interpolate between samples. The coefficients for the quadratic $f(x)=ax^2+bx+c$ are determined from two samples, $y_1$ and $y_2$, and the slope at the first sample, $y_1'$.

However, interpolators based directly on the quadratic $f(x)=ax^2+bx+c$ equation tend to be complex. Therefore, the following simplified equations represent quadratic interpolation from 1 to m samples, for implementing a quadratic interpolator. If m is large, the amount of work required to evaluate each interpolation is approximately 2 adds/point. Simplified Quadratic interpolator Equations:

$$f(0)=c$$

$$df(0)=b+a$$

$$ddf(\ )=2a$$

$$f(x)=f(x-1)+df(x-1) \quad x=1,\ldots,m_i-1$$

$$df(x)=df(x-1)+ddf(\ ) \quad x=1,\ldots,m_i-1$$

where $$a=((y_2-y_1)-y_1'm_i)/m_i^2$$

$$b=y_1'$$

$$c=y_1$$

$$y_2'=2am_i+b(=\text{next } y_1')$$

With quadratic spline interpolation, harmonics are located relative to the fundamental(s) of the sinusiod(s), $\omega_0$, which comprise the signal and are at $\omega_f-\omega_0$ with amplitude $-60\cdot\log_{10}(\omega_f/\omega_0-1)$.

In the above equations, f( ) represents an estimated new sample between original samples of the input stream. Therefore, f(0) represents the value of a first sample. df( ) represents a difference between a particular estimated sample and the previous estimated sample. Therefore, df(2) represents a difference between a second estimated and the first estimated sample. Similarly, ddf( ) represents a difference between a particular df( ) and the previous df( ) and is constant between the inputs to the Spline interpolator. df( ) and ddf( ) are, respectively, estimates of the first and second derivatives of f( ).

FIG. 4 is a block diagram illustrating the operation of a quadratic Spline interpolator based on the above simplified quadratic interpolator equations, according to an embodiment of the present invention. Blocks 50, 52, 54, 56 and 58 represent blocks which hold ddf( ), df(0), f(0), df(x) and f(x), respectively. The Spline interpolator also includes adders 60 and 62, and multiplexers (MUX) 64 and 66. Multiplexers 64 and 66 are controlled by a select signal SEL that is active when a new sample is received. Adder 60 receives ddf( ) held by block 50 and df(x) held by block 56. Adder 62 receives f(x) held by block 58 and df(x) held by block 56. In accordance with the select signal SEL, multiplexer 64 controls whether block 56 receives either the summed output of adder 60 or df(0) for the computation of df(x). Similarly, in accordance with the select signal SEL, multiplexer 66 controls whether block 58 receives either the summed output of adder 62 or f(0) for the computation of f(x).

Figure 5:
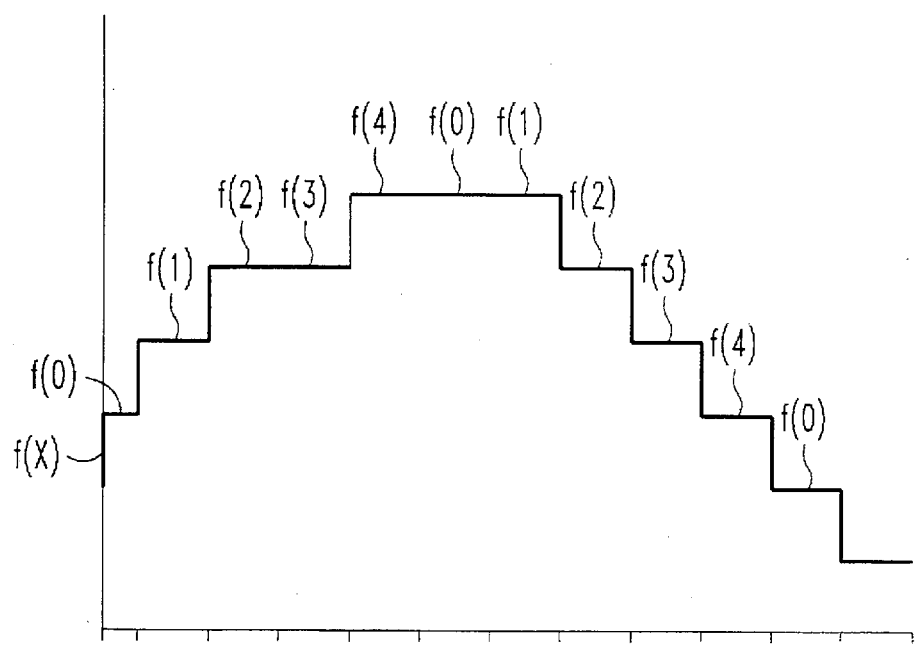
FIG. 5 is a diagram illustrating the output of a Spline interpolator, according to an embodiment of the present invention.
Figure 6:
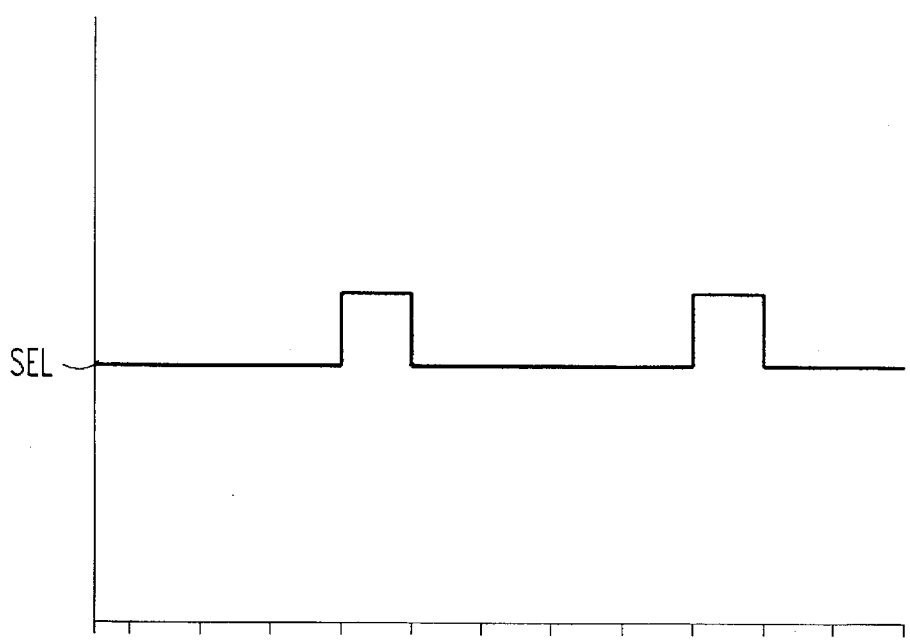
FIG. 6 is a diagram illustrating a select signal for controlling multiplexers of the Spline interpolator of FIG. 4, according to an embodiment of the present invention.

Operation of the Spline interpolator illustrated in FIG. 4 can be understood by referring to FIGS. 5 and 6. FIG. 5 illustrates an example of the output f(x) of the Spline interpolator, where the number of samples added by interpolation equals four. The Spline interpolator then uses ddf( ), df(0), f(0), df(x) and f(x) to compute the value of each added sample. FIG. 6 illustrates the select signal SEL for controlling multiplexers 64 and 66. As illustrated by FIGS. 4, 5 and 6, the select signal SEL is low during the clock cycles of f(0), f(1), f(2) and f(3), and goes high during the clock cycle corresponding to f(4). Therefore, during the clock cycles of f(0), f(1), f(2) and f(3), multiplexer 64 selects the summed output of adder 60, and multiplexer 66 selects the summed output of adder 62. Also, during the clock cycle of f(4), multiplexer 64 selects df(0) and multiplexer 66 selects f(0). In this manner, the Spline interpolator can be described as being "reset" upon receipt of the next sample in the input stream, so that the values df(0) and f(0) are loaded when a new sample is received.

3. Spline Spurs

As illustrated in FIG. 1, FIR filter 23 precedes Spline interpolator 22. As a result, output harmonics of the FIR-Spline interpolated signal 28 will be reduced by the combination of the FIR filter response and Spline interpolator harmonic response. Generally, Spline is a non-linear function, thereby creating harmonics. Therefore, Spline interpolation has not been used conventionally in certain applications (for example, in radio communications). However, according to the present invention, sample harmonics are smoothed out with FIR interpolation using zero order hold in the first stage of interpolation. As a result, a Spline interpolator can be used as a second stage interpolator after the FIR interpolation because of the high sample rate out of the FIR interpolator. This combination of FIR-Spline interpolation works well and does not produce large harmonics.

For a FIR filter with pass band cutoff frequency $\omega_p$, stop band cutoff frequency $\omega_s$, stop band attenuation $\Delta_s$ (dB), and transition band attenuation varying linearly from 0 dB $\Delta_s$, Spline interpolator spurs are bounded by the equation below.

$$\text{spurs}_{spline} \leq \begin{cases} -60\cdot\log_{10}(\omega_f/\omega_o-1) & \omega_o \leq \omega_p \\ \dfrac{\omega_o-\omega_p\Delta_{sin}}{\omega_s-\omega_p}-60\cdot\log_{10}(\omega_f/\omega_o-1) & \omega_p \leq \omega_o \leq \omega_s \\ \Delta_s-60\cdot\log_{10}(\omega_f/\omega_o-1) & \omega_s \leq \omega_o \leq \omega_f/2 \end{cases}$$

Solving these equations for $\omega_f$ gives $$\omega_f \geq \begin{cases} (10^{-spurs/60+1}\omega_0) & \omega_0 \leq \omega_p \\ (10^{-spurs+\frac{\omega_0-\omega_p}{\omega_s-\omega_p}\Delta_s} + 1)\omega_0 & \omega_p \leq \omega_0 \leq \omega_s \\ (10^{\frac{-spurs+\Delta_{sin}}{60}} + 1)\omega_0 & \omega_s \leq \omega_0 \leq \omega_f/2 \end{cases}$$

Interpolation Rate

Although FIG. 1 illustrates an overall interpolation method which uses a combination of FIR interpolation and Spline interpolation, the overall rate of interpolation can be determined separately from whether FIR interpolation, Spine interpolation or a combination of FIR interpolation and Spline interpolation is used. That is, referring now to FIG. 1, an overall interpolation rate can be determined from input signal 24 (having a sample rate of $w_b$) to FIR-Spline interpolated signal 28 (having a sample rate of $w_i$). For example, consider the interpolation of a digitized voice sample prior to transmission. In the following equations, $w_s$ and $w_p$ relate to the stop band and pass band, respectively, of an anti-aliasing filter (not illustrated) used prior to A/D conversion of the audio (voice) signal to be transmitted. A perfect interpolator generating points for a $\cos(\omega_0 t)$ sinusoid at an $\omega_i$ sample rate will have first harmonic located at $\omega_i-\omega_0 \approx \omega_i$ with amplitude $-20\cdot\log_{10}(\omega_i/\omega_0-1) \approx -20\cdot\log_{10}(\omega_i/\omega_0-1)$ dB relative to the fundamental due to sampling. Assuming $\omega_i \ll B_i$, harmonic amplitude (spurs) after analog filtering for input signal 24 having baseband bandwidth $\omega_0$ is approximated by the equation below.

$$\text{spurs}_{int\_rate} = \begin{cases} -20 \cdot \log_{10}(\omega_0/\omega_0) - 20 \cdot p \cdot \log_{10}(\omega/B_{if}) & \omega_0 \leq \omega_p \\ \Delta_{sin} \dfrac{\omega_0 - \omega_p}{\omega_s - \omega_p} - 20 \cdot \log_{10}(\omega/B_b) - 20 \cdot p \cdot \log_{10}(\omega/B_{if}) & \omega_p \leq \omega_0 \leq \omega_s \\ \Delta_{sin} - 20 \cdot \log_{10}(\omega/\omega_0) - 20 \cdot p \cdot \log_{10}(\omega/B_{if}) & \omega_s \leq \omega_0 \leq B_b \end{cases}$$

Solving for the interpolation rate gives $$\omega_0 \geq \begin{cases} 10^{\left(\dfrac{-\text{spurs}/20 + \log_{10}(\omega_0) + p \cdot \log_{10}(B_{if})}{p+1}\right)} \omega_0 & \omega_0 \leq \omega_p \\ 10^{\left(\dfrac{\dfrac{-\text{spurs}}{20} + \dfrac{\Delta_{sin}}{20} \dfrac{\omega_0 - \omega_p}{\omega_s - \omega_p} + \log_{10}(\omega_0) + p \cdot \log_{10}(B_{if})}{p+1}\right)} \omega_0 & \omega_p \leq \omega_0 \leq \omega_s \\ 10^{\left(\dfrac{-\text{spurs} + \Delta_{sin}}{20} + \log_{10}(\omega_0) + p \cdot \log_{10}(B_{if})}{p+1}\right)} \omega_0 & \omega_s \leq \omega_0 \leq B_b \end{cases}$$

Interpolator Precision and Width

Interpolator precision is determined by desired output precision and number of interpolation points $m_i$. Every add (for example, every add in adder 60 of the Spline interpolator in FIG. 4) in the interpolation has an error associated with it bounded by $q/2$ where $q$ is the quantization of the numbers being added. Note that the mean error per addition of $q/12^{0.5}$ should not be used since the errors from addition to addition in spline interpolation are highly correlated. The number of iterations of $f(x)$ at the conclusion of interpolation is $m_i-1$ since determination of the first point $f(0)$ does not require an iteration. For $m_i$ large, the number of iterations is approximately $m_i$. Let $q_{iq}$, $q_f$, $q_{df}$ designate the desired accurate quanta in the interpolator output, quanta calculated in $f(x)$, and quanta calculated in $df(x)$, respectively. In the linear interpolation case, the error is maximum at the conclusion of interpolation and bounded by $m_i q_f/2$. Therefore, to maintain the desired accuracy, $m_i q_f/2 \leq q_{iq}$ or $q_f \geq 2q_{iq}/m_i$ must be satisfied. In the quadratic interpolation case, the error is maximum at the conclusion of interpolation and bounded by $m_i q_f/2 + m_i^2 q_{df}/4$. If half of the error is allocated to each term, the desired accurate quanta is maintained if $q_f \leq q_{iq}/m_i$ and $q_{df} \leq 2q_{iq}/m_i^2$.

Spline interpolator adder width (such as the adder width of adder 60 in FIG. 4) is determined by the maximum change a parameter can make in one add time. Spline input is composed of sinusoids of the form $V = A\cos(\omega t)$. The slope of a sinusoid is $dV/dt = -A\omega\sin(\omega t)$. Therefore the maximum change in interpolator output $V$ occurs when $\sin(\omega t)$, $A$, and $\omega$ are all at their respective maximums of 1, 1, and $\omega_{3db}$, the 3 dB cutoff frequency of previous filtering. Thus, the magnitude of $dV$ for $dt = 1/f_i$ is bounded by $$dV \leq \omega_{3db} dt = 2\pi f_{3db}/f_i.$$

Thus, maximum magnitude of $dr(x)$ relative to quanta of $df(x)$ is $2\pi f_{3db}/(f_i q_{df})$. The change in slope of a sinusoid is $d^2V/dt^2 = -A\omega^2\cos(\omega t)$. The magnitude of $d^2V$ is bounded by $$d^2V \leq \omega_{3db}^2 dt^2 = 4\pi^2 f_{3db}^2/f_i^2.$$

Therefore, the maximum magnitude of $ddf(x)$ relative to quanta of $ddf(x)$ is $4\pi^2 f_{3db}^2/(f_i^2 q_{ddf})$.

Use of Interpolation in a Programmable Digital Radio

The present invention relates to interpolation of digital samples and is best understood as applied in a specific type of system. Therefore, the following is an example of interpolation applied in a programmable digital radio (as described, for example, in related disclosure entitled DIGITALLY PROGRAMMABLE MULTIFUNCTION RADIO SYSTEM ARCHITECTURE, previously mentioned) programmed to transmit an amplitude modulated carrier in the VHF region of the frequency spectrum (VHF AM), according to embodiments of the present invention. More specifically, the following is an example of interpolation used in a common transmit module of a programmable digital radio, as described, for example, in related disclosure entitled COMMON TRANSMIT MODULE FOR A PROGRAMMABLE DIGITAL RADIO, previously mentioned. VHF AM generally requires interpolation of a digital input stream and is therefore a good example where embodiments of the present invention can be effectively utilized.

OVERVIEW OF COMMON TRANSMIT MODULE

Figure 7A:
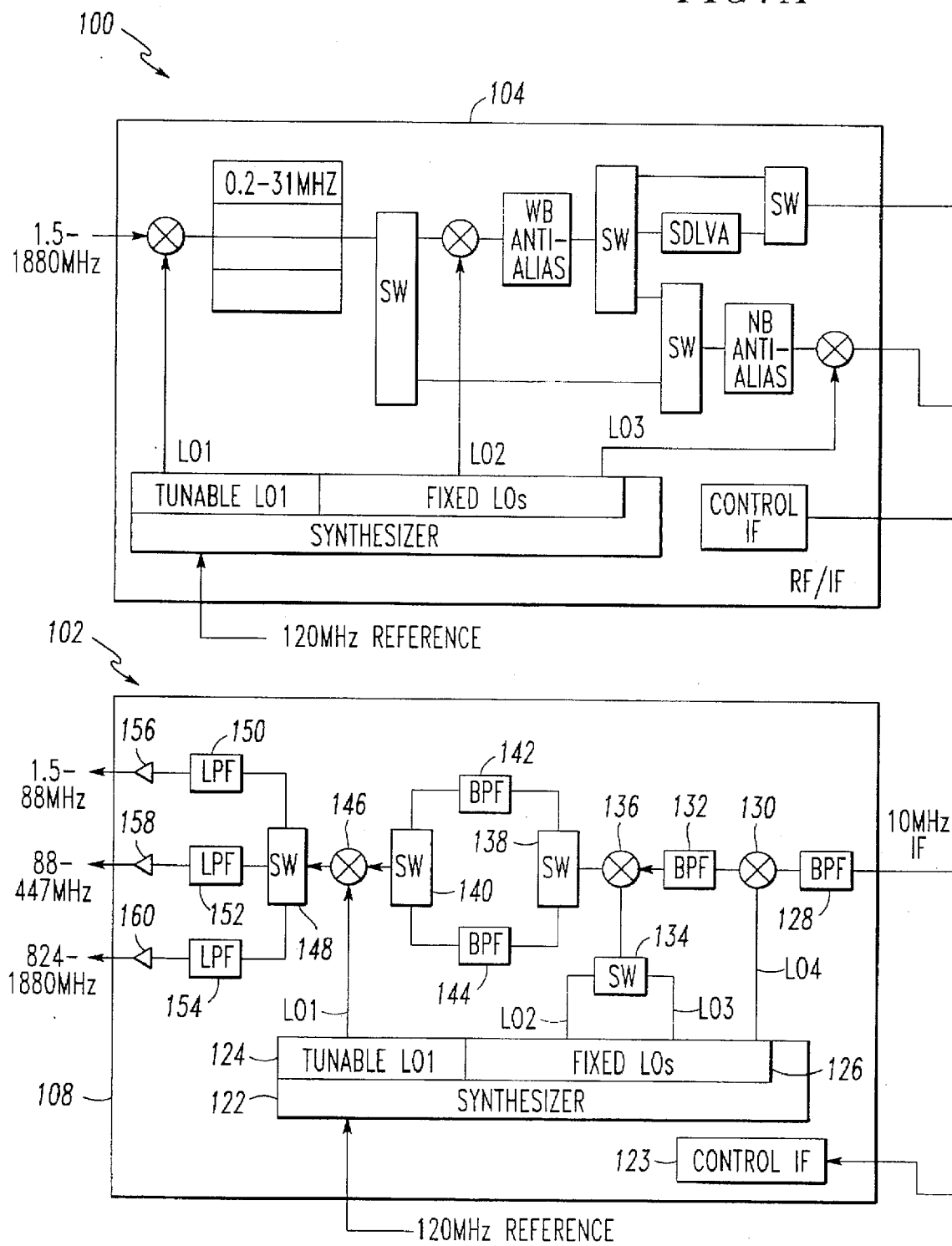
FIG. 7 is a block diagram illustrating a common receive module and a common transmit module, according to an embodiment of the present invention.
Figure 7B:
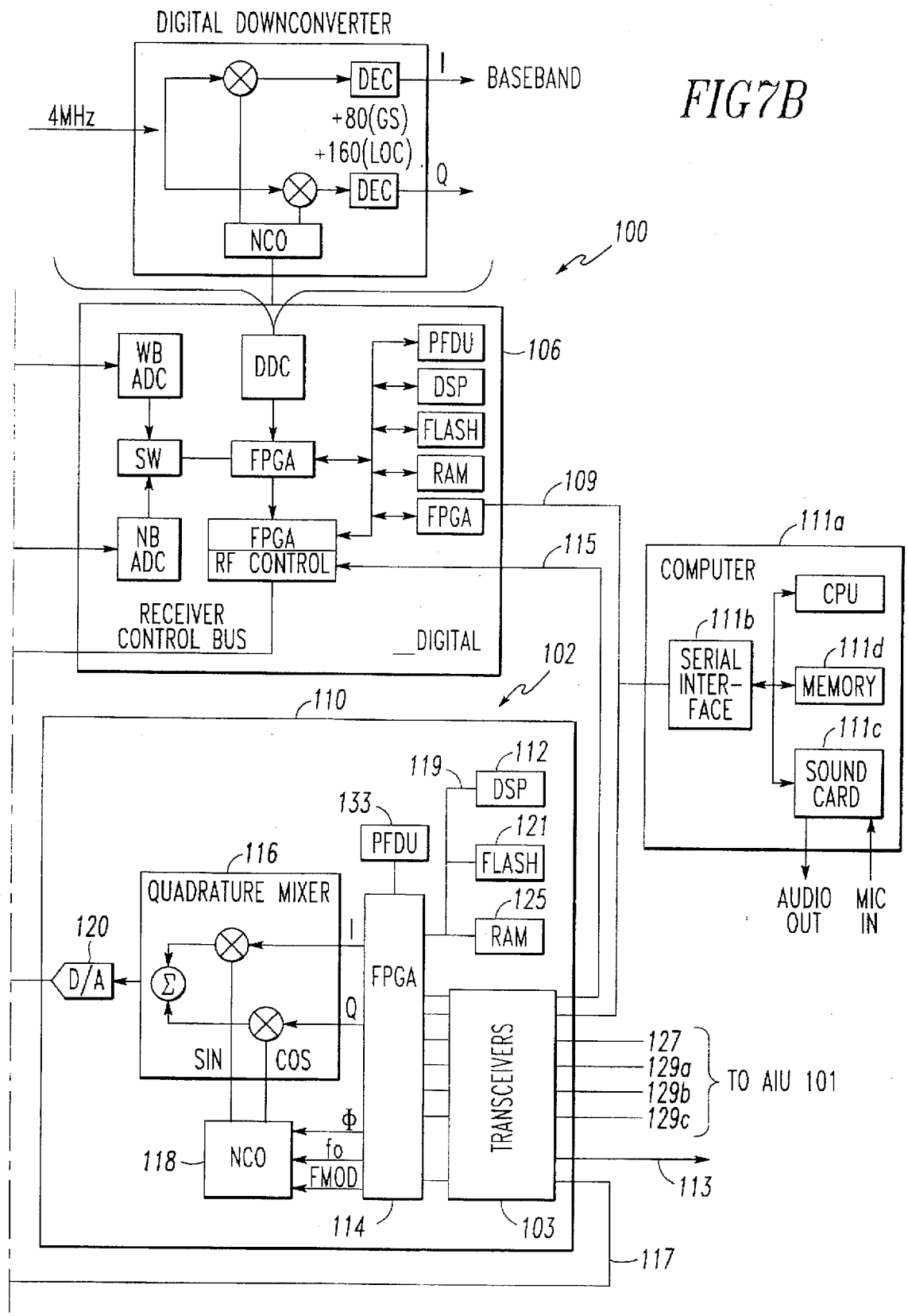

FIG. 7 is a block diagram illustrating a common receive module 100 and a common transmit module 102 of a programmable digital radio according to an embodiment of the present invention. A programmable digital radio is described in related disclosure entitled DIGITALLY PROGRAMMABLE MULTIFUNCTION RADIO SYSTEM ARCHITECTURE, previously mentioned. Common receive module 100 comprises an analog submodule 104 and a digital submodule 106, and is described in related disclosure entitled COMMON RECEIVE MODULE FOR A PROGRAMMABLE DIGITAL RADIO, previously mentioned. Thus, a description of common receive module 100 will not be repeated herein. Common transmit module 102 is described in related disclosure entitled COMMON TRANSMIT MODULE FOR A PROGRAMMABLE DIGITAL RADIO, previously mentioned.

Common receive module 100 and common transmit module 102 are reprogrammable to receive signals and transmit signals, respectively, for different communication, navigation and identification (CNI) applications. Thus, for example, common transmit module 102 can be programmed to transmit signals in an air traffic control radar beacon system (ATCRBS), and then quickly reprogrammed to transmit signals in a VHF AM system.

Common transmit module 102 is partitioned into an analog submodule 108 and a digital submodule 110. Relatively low-speed serial data messages or information signals corresponding the various communication, navigation and identification (CNI) functions are fed into common transmit module 102. The low-speed data messages or information signals are digitally processed in digital submodule 110 according to the communication, navigation and identification (CNI) configuration programmed therein and converted by digital submodule 110 to an analog signal. The analog signal is then frequency translated to the proper RF frequency band within the approximate 2 MHz to 2,000 MHz region in analog submodule 108. The frequency translated signal is then provided to an appropriate antenna interface unit (AIU) (not illustrated, but see related disclosure entitled DIGITALLY PROGRAMMABLE MULTIFUNCTION RADIO SYSTEM ARCHITECTURE, previously mentioned) where it undergoes power amplification and filtering, and is routed to the proper antenna (not illustrated) for transmission.

As a general overview of the operation of common transmit module 102, an information signal in a digital, serial format is received over a system bus 109 and reformatted by a conventional field programmable gate array (FPGA) 114 and then provided to a conventional digital signal processor (DSP) 112 of digital submodule 110. As explained in the related disclosure entitled DIGITALLY PROGRAMMABLE MULTIFUNCTION RADIO SYSTEM ARCHITECTURE, previously mentioned, system bus 109 can be partitioned into separate busses for control and data flow. DSP 112 performs conventional digital signal processing in accordance with the specific communication, navigation or identification (CNI) function programmed therein. For example, if required for a particular application, DSP 112 can be programmed to perform interpolation and baseband arithmetic processing (such as an arithmetic manipulation of the input data stream in accordance with Table II, discussed later) to produce the desired type of modulating signal. In addition, DSP 112 serves as a controller for the elements in digital submodule 110. DSP 112 then transfers the digitally processed information signal to FPGA 114 of digital submodule 110. The term "FPGA" includes multiple, physically separate FPGAs that are interconnected to essentially function as a single, larger FPGA.

FPGA 114 is reconfigurable for specific communication, navigation and identification (CNI) functions by loading data files into FPGA 114, where the data files indicate the desired configuration. Thus, FPGA 114 performs additional signal processing in accordance with the specific communication, navigation or interrogation (CNI) function formatted therein. For example, FPGA 114 can be formatted to perform pulse coded modulation when functioning in an air traffic control radar beacon system (ATCRBS), or interpolation when functioning in a VHF AM system. FPGA 114 is a flexible unit, portions of which can also be internally or externally configured to supply control of analog submodule 108. Such control of analog submodule 108 can include tuning and switching via tune bus 117, control of transmit resources in AIU 101 via transmit control bus 127 or transmit discretes 129a, 129b and 129c, and I/O control with other system units. These control interfaces can be programmed to be serial or parallel, and asynchronous or synchronous as required to include both standard and custom protocols. Since FPGA 114 is reprogrammable for the transmission of different communication, navigation and identification (CNI) functions, FPGA 114 can be referred to as a "reconfigurable format unit" to place the information signal in a format corresponding to the type of radio transmission being performed. Thus, for example, common transmit module 102 is programmable to transmit signals in either an air traffic control radar beacon system (ATCRBS) or a VHF AM system by reformatting FPGA 114 for the particular application.

FPGA 114 can be configured by sending data files representing format data to FPGA 114 over system bus 109 (such as a conventional RS 485 format) from external memory (such as memory 111d of an external computer 111a or memory associated with a communication, navigation and identification (CNI) controller (not illustrated, but described in related disclosure entitled DIGITALLY PROGRAMMABLE MULTIFUNCTION RADIO SYSTEM ARCHITECTURE, previously mentioned)). Thus, in FIG. 7, computer 111a can be considered to be functioning as a communication, navigation and identification (CNI) controller. However, the structure of digital submodule 110 also permits FPGA 114 to be reconfigured in a very short time (for example, 20 milliseconds) to perform a different type of radio function without requiring a change in hardware and the accompanying tests. For example, a conventional non-volatile memory (NVM), such as a programmable flash memory (FLASH) 121, and a conventional random access memory (RAM) 125 are connected to a conventional local bus 119 to allow flash memory 121 and RAM 125 to interact with DSP 112 and FPGA 114. Therefore, as illustrated in FIG. 7, DSP 112 is connected to FPGA 114 via local bus 119. Information is transferred from computer 111a to flash memory 121 and RAM 125 by first transferring information over system bus 109 to FPGA 114. FPGA 114, having a portion which acts as a conventional UART, then transfers the information to local bus 119. Computer 111a then downloads a computer program for programming DSP 112 and data files for formatting FPGA 114 in accordance with the specific type of radio function to be performed, to RAM 125 via local bus 119. In this manner, information corresponding to the different types of radio functions can be stored in RAM 125. This information includes a computer program that runs DSP 112 and data files for configuring FPGA 114.

If desired for a fast response time, such as when the programmable common transmit module is functioning as a spare unit for a failed transmit module associated with a specific radio function, the downloaded program for this radio function, including the FPGA configuration, can be executed immediately. Then, at a convenient time such as when the radio function is in the receive mode, DSP 112 automatically executes a computer program that instructs DSP 112 to copy the information into flash memory 121. When the power to digital submodule 110 is disconnected and then reapplied to digital submodule 110, a boot program instructs DSP 112 to copy the information from flash memory 121, which is non-volatile memory, into RAM 125.

Depending upon the amount of memory available in flash memory 121 and RAM 125, computer programs for DSP 112 and FPGA data files for FPGA 114 corresponding to several radio functions can be downloaded into RAM 125 and copied to flash memory 121. Then, instead of configuring FPGA 114 by sending commands and data files over system bus 109 from computer 111a, FPGA 114 can be configured for a specific type of radio function by instructing DSP 112 over system bus 109 with a brief configuration command to download the application data files from flash memory 121 to RAM 125 and subsequently configure FPGA 114 and DSP 112 with the selected data files prior to executing the application program. Therefore, DSP 112 only needs to receive information over system bus 109 to indicate which type of radio function is intended to be transmitted.

As a result, the time to reconfigure FPGA 114 is reduced since data files do not have to be transferred over system bus 109.

If the particular application requires that the information signal is "smoothed", DSP 112 performs signal interpolation by digital processing of the samples to increase the number of data points between samples. DSP 112 also performs baseband arithmetic processing or other types of digital signal processing, as required for a particular application. Interpolation and other signal processing can also be performed by FPGA 114. Once a data signal with the desired format and number of data points is produced by passing through DSP 112 and FPGA 114, the data signal is supplied by FPGA 114 to a conventional quadrature mixer 116. Quadrature mixer 116 digitally modulates oscillation signals from a conventional numerically controlled oscillator 118 with the data signals from FPGA 114. The modulated data points are then supplied to a conventional digital to analog converter 120. Digital to analog converter 120 provides an analog output signal to a conventional band pass filter (BPF) 128 of analog submodule 108. BPF 128 may actually be two or more filters in a bank of filters that are switched in accordance with the specific CNI radio function being transmitted. The number of filters in the filter bank can be increased if warranted by the spurious signal spectrum for different radio functions out of digital to analog converter 120.

The signal output by BPF 128 is converted by a conventional first mixer 130. First mixer 130 also receives a local oscillator signal (LO4) from a fixed local oscillator unit 126 that produces a second local oscillator signal LO2, a third local oscillator signal LO3 and fourth local oscillator signal LO4. Depending upon the target radio frequency of the signal, conventional switches 134, 138, 140 and 148 route LO2, LO3, LO4 and the signal through conventional band-pass filters 128, 132, 142, 144, lowpass filters 150, 152 and 154 and conventional mixers 136 and 146. Mixers 136 and 146 convert the signal to the target frequency using oscillator signals from a synthesizer 122. Additional switch and filter configurations for analog submodule 108 are discussed in related disclosure entitled COMMON TRANSMIT MODULE FOR A PROGRAMMABLE DIGITAL RADIO, previously mentioned.

Furthermore, those of skill in the art can utilize a reconfigurable format unit such as FPGA 114 to adaptively route signals among the various units within digital submodule 110. For example, input signals could be routed first either through DSP 112 for processing (including filtering) or through one or more conventional filter units such as a conventional, optional programmable digital filter unit or units (PDFU) 133. Two such units would be used for filtering both I and Q signal components, and only one such filter would be used, for example, for filtering the combined output of quadrature mixer 116. PDFU 133 is an optional unit that could be added to future embodiments in order to provide more efficiently in hardware than can be provided in DSP 112.

The unique, flexible and functionally efficient digital processing architecture such as that provided by quadrature mixer 116, numerically controlled oscillator 118, FPGA 114, DSP 112 (e.g., a sequential/parallel instruction processor, CPU or digital signal processor), FLASH memory 121, RAM 125, and PDFU 133, can be programmed by those of skill in the art, particularly with the application notes available with these various units, to perform various processing functions on various type signals, including signals associated with various radio functions. These processing functions can include, for example, interpolation, filtering, oscillation generation, waveform modulation of any combination of amplitude, frequency and phase modulation, pulse width and pulse interval formation, input signal reformatting, fine frequency hopping (coarse frequency hopping is performed in the analog submodule), signal level control, channel control (e.g. gain, signal path switching, tuning) in both digital submodule 110 and analog submodule 108, control of the associated AIU (such as for tuning, switching, modulating or strobing for pulse registration), reply rate limiting, flexible I/O configuration for all interfaces both internal to programmable common transmit module 102 as well as to external units, management/configuration of all programmable common transmit module resources, and BIT control/reporting.

An applique interface 113 can interface an optional external applique module (not illustrated) directly to D/A converter 120, preferably through FPGA 114 by passing through a conventional transceiver in a conventional transceiver package 103 and possibly through quadrature mixer 116. In some cases, an information signal can be routed from system bus 109, to the applique module, and then to the transmit module 102. In other cases, an information signal from system bus 109 is routed first to transmit module 102 for preprocessing, and then back to transmit module 102 for D/A conversion. See related disclosure entitled DIGITALLY PROGRAMMABLE MULTIFUNCTION RADIO SYSTEM ARCHITECTURE, previously mentioned, for a discussion of these issues.

Tuning and other frequency conversion operations performed in common transmit module 102 include (i) obtaining, from an external controller or computer 111a via system bus 109, a specific frequency channel number or specific frequency in appropriate units (such as Hertz), as well as other information (such as wideband or narrowband filter select) (ii) arithmetically calculating and, where needed, creating tuning commands in DSP 112 for proportioning of tuning between numerically controlled oscillator 118 and a tunable LO1 124, (iii) reformatting the data in FPGA 114, (iv) passing data to numerically controlled oscillator 118, and (v) passing data to tunable LO1 124 via tune bus 117 whereby a control interface (control IF) 123, based upon the selected frequency band, provides control inputs for controlling the various switches and oscillation signals in analog submodule 108. Also, based upon the selected frequency band, control interface 123 provides the proper control signals for switches 134, 138, 140 and 148.

Similarly, tuning data is processed in DSP 112, reformatted in FPGA 114 and related to the associated AIU via transmit control bus 127 for control of filters, switches, etc. Also, transmit control bus 127 can be used to pass instantaneous modulation information to optimize the operating point, and thus the efficiency, of a power amplifier in the AIU.

The operation of common transmit module 102 is more specifically described below by referring to FIG. 7. Digital submodule 110 includes conventional transceiver package 103. Via transceiver package 103, system bus 109 connects digital submodule 110 to external devices such as conventional computer 111a containing a conventional serial interface 111b, a conventional sound card 111c, and a conventional memory 111d. A conventional microphone (not illustrated) converts voice signals to electrical signals and provides the electrical signals to sound card 111c. Via transceiver package 103, a transpond bus 115 connects digital submodule 110 of common transmit module 102 to digital submodule 106 of common receive module 100.

Generally, in a conventional manner, transceiver package 103 convert the voltage level of signals on system bus 109 and transpond bus 115, respectively, to voltage levels required by FPGA 114. Similarly, transceiver package 103 converts voltage levels on applique interface 113 to those required by FPGA 114. Transpond bus 115 is used when transpond functions require transfer of information between common transmit module 102 and common receive module 100. For example, transpond bus 115 is used when common transmit module 102 and common receive module 100 are programmed for a conventional air traffic control radar beacon system (ATCRBS), as disclosed in related disclosure entitled DIGITALLY PROGRAMMABLE RADIO MODULES FOR TRANSPONDER SYSTEMS, previously mentioned. Transpond bus 115 is not used, for example, when common transmit module 102 is programmed for a conventional VHF AM system since a transpond function is not required with VHF AM.

As previously described, DSP 112 loads data files from RAM 125 into FPGA 114 to reconfigure FPGA 114 for the particular application. DSP 112 is a conventional digital signal processor. Also, as previously described, a portion of FPGA 114 is reconfigured to function as a conventional UART to provide an interface between system bus 109 and FPGA 114. FPGA 114 is a conventional field programmable gate array (FPGA).

If required for a particular application, such as with VHF AM, FPGA 114 can be reconfigured to perform interpolation on an information signal received over system bus 109. For example, when an input signal is sampled at a rate of 8 KHz with eight bits per sample and is serially transferred to FPGA 114, interpolation by one-thousand (1,000) can be performed to produce a smooth set of samples at an 8 MHz sample rate per second. This reduces the quantization errors caused by the transition between the original 8 KHz samples. DSP 112 is preferably used in conjunction with FPGA 114 to perform interpolation. However, all interpolation can be performed in either DSP 112 or FPGA 114. Certain communication, navigation and identification (CNI) functions, such as air traffic control radar beacon system (ATCRBS), do not require interpolation. Thus, DSP 112 and FPGA 114 do not perform interpolation when common transmit module 102 is configured for such a communication, navigation and identification (CNI) function.

As previously described, DSP 112 is programmable by downloading a computer program from computer 111a via system bus 109 in a conventional manner. For example, depending on a particular application and the type of modulation, DSP 112 can be programmed in a conventional manner to function as a baseband arithmetic processor (see baseband arithmetic processor 300 in FIG. 8), thereby producing a baseband information modulating signal including an in-phase (I) signal, a quadrature (Q) signal, a phase ($\phi$) signal and a frequency (f) signal in the proper digital format. The frequency signal (f) is illustrated in FIG. 7 as comprising a oscillation frequency component $f_o$ and a frequency modulation component (FMOD) for frequency modulating the oscillation frequency. Thus, DSP 112 is programmable so that common transmit module 102 transmits virtually any type of modulation. Such baseband modulation by a digital signal processor is well-known.

The following Table I illustrates conventional examples of the type of modulation and form of the modulation information for various communication, navigation and identification (CNI) functions, and the following Table II illustrates which of the in-phase, quadrature, phase and frequency signals of DSP 112 are required to transmit various types of modulation. Modulation information is represented by m(t). The amplitude of m(t) can be arithmetically manipulated in baseband arithmetic processor 300 (see FIG. 8) of DSP 112 to produce the desired type of modulation in accordance with Table II, below. In Tables I and II, ASK represents amplitude shift keying, AM represents amplitude modulation, SC represents suppressed carrier, PCM represents pulse coded modulation, PPM represents pulse position modulation, DSB represents double side band, SSB represents single side band, FM represents frequency modulation, PM represents phase modulation, PSK represents phase shift keying, ASK/PSK represents simultaneous amplitude and phase shift keying, MSK represents minimum shift keying, and QM represents quadrature (phase) modulation. ATCRBS, MODE-S interrogate, TACAN, VHF-AM and SATCOM are conventional communication, navigation and identification (CNI) functions.

TABLE I

| FUNCTION | MODULATION | REFERENCE FOR m(t) VALUES |
|---|---|---|
| HF | AM, AM-SC, SSB, FM, FSK, PSK | RTCA/DO-163 plus various commercial and military specs |
| VHF | AM | RTCA/DO-186 plus military specs |
|  | FM | Military SINCGARS specs |
| UHF | AM, FM, FSK | Military Specs |
| UHF SATCOM | PM-QM, FSK | Military Specs |
| EPLRS | MSK derivative | Military Specs |
| Airphone | SSB |  |
| DME/N/P | PPM, shaped PPM | RTCA/DO-189 |
| ATCRBS | PCM | RTCA/DO-181A |
| Mode S | PPM | RTCA/DO-181A |
| TCAS | PPM, PSK | RTCA/DO-185 |
| SATCOM | PM-QM | AMSC MSS-DOC-1021 |
| TACAN* | PCM | Military Specs |
| JTIDS | MSK derivative | Military Specs |

*TACAN pulses may be shaped in the power amplifier in the antenna interface unit (AIU).

TABLE II

| Modulation | I | Q | $\phi$ | f |
|---|---|---|---|---|
| AM, ASK | 1 +m(t) | 0 | 0 | $f_o$ |
| AM-SC, PPM | m(t) | 0 | 0 | $f_o$ |
| AM-SC-SSB | m(t) | +m(t)$^1$ | 0 | $f_o$ |
| ASK/PSK | $m_1(t)$ | $m_2 t$ | 0 | $f_o$ |
| FM, FSK | 1 | 0 | 0 | $f_{o\ +m(t)}$ |
| PM, PSK | 1 | 0 | m(t) | $f_o$ |
| PM-QM | $m_1(t)$ | $m_2(t)$ | 0 | $f_o$ |

In Table II, m(t)$^1$ refers to a ninety degree phase shifted version of m(t). This function is commonly referred to as a Hilbert transform and can be calculated by convolution of m(t) with $1/(\pi t)$. $m_1(t)$ and $m_2(t)$ refer to orthogonal modulation indices. The inclusion of other forms of modulation into Table II, such as MSK, can be made by a person skilled in the art.

As an example, if DSP 112 is programmed to transmit AM modulation, DSP 112 would produce an in-phase (I) signal and a frequency (f) signal, as indicated by Table II. When transmitting VHF AM modulation, DSP 112 is not required to produce a quadrature signal or a phase signal. The production of appropriate in-phase, quadrature, phase or frequency signal from DSP 112, based on the required modulation, is well-known.

The in-phase, quadrature and phase signals produced by DSP 112 are sent to FPGA 114. In FPGA 114 and depending on the particular application in which common transmit module 102 is being used, the in-phase, quadrature and phase signals can be, for example, interpolated or formatted by pulse coded modulation. FPGA 114 also sends a control signal via tune bus 117, which includes a differential clock and a differential serial data stream produced by transceiver package 103, to control interface 123 of analog submodule 100. The control signal controls upconversion variables of analog submodule 100. These upconversion variables are parameters embedded in the DSP programs of each application. Control interface 123 includes transceivers similar to transceiver package 103 plus an electronically programmable logic device (EPLD) which is a synchronous serial interface that accepts the synchronous serial tuning data and formats it into the type of data needed to control synthesizer 122. When based upon the selected frequency band, control interface 123 accepts the synchronous serial tuning data and formats it to the type of data needed to control switches 134, 138, 140 and 148, based upon the supplied filter requirements (such as wideband or narrowband). The upconversion variables are determined by baseband arithmetic processor 300 (see FIG. 8) in DSP 112.

From FPGA 114, the interpolated or formatted signals are sent to conventional quadrature mixer 116. Similarly, depending on the application, the signals of DSP 112 can be sent to quadrature mixer 116 via FPGA 114 without being interpolated or formatted. In this case, FPGA 114 acts as an interface between DSP 112 and quadrature mixer 116. Via FPGA 114, the frequency signal produced by DSP 112 is received by conventional numerically controlled oscillator 118. In response to the frequency signal produced by DSP 112, numerically controlled oscillator 118 acts as a digital local oscillator to produce a sequence of digital samples of the desired oscillation signal. Numerically controlled oscillator 118 also performs phase and frequency modulation of the oscillation. The digital oscillation signal produced by numerically controlled oscillator 118 is received by quadrature mixer 116. Quadrature mixer 116 conventionally generates a digital waveform in accordance with the in-phase, quadrature and phase signals received from FPGA 114, and the digital oscillation signal received from numerically controlled oscillator 118. Thus, the combination of numerically controlled oscillator 118 and quadrature mixer 116 together form a modulator which produces a digitally modulated oscillation signal. The combined operation of quadrature mixer 116 and numerically controlled oscillator 118 is well known. The digital modulated oscillation signal produced by numerically controlled oscillator 118 and quadrature mixer 116 is supplied to conventional digital to analog converter 120. Digital to analog converter 120 receives the digitally modulated oscillation signal and converts the digitally modulated oscillation signal to an analog modulated oscillation signal. The analog modulated oscillation signal represents a first analog intermediate frequency (IF) signal and is provided to analog submodule 108. The intermediate frequency of the analog modulated oscillation signal is preferably at 10 MHz. FPGA 114 also sends a control signal, via tune bus 117, to control interface 123 of analog submodule 102.

Analog submodule 108 of common transmit module 102 includes a synthesizer 122, a tunable local oscillator (Tunable LO1) 124 which produces a first local oscillator signal LO1, and a series of interconnected fixed local oscillators (fixed LOs) 126 which produce a second local oscillator signal LO2, a third local oscillator signal LO3 and a fourth local oscillator signal LO4. These fixed local oscillators 126 are described in more detail in related disclosure entitled COMMON TRANSMIT MODULE FOR A PROGRAMMABLE DIGITAL RADIO, previously mentioned.

The first analog intermediate frequency signal produced by digital to analog converter 120 is transferred from digital submodule 110 and is received by conventional bandpass filter (BPF) 128. BPF 128 passes wideband signals at 10 MHz, plus or minus 4 MHz; however, BPF 128 can be a switched bandpass filter bank of filters for wideband and narrowband signals. Thus, instead of being passed through BPF 128, the first analog intermediate frequency signal can be switched through, for example, either a first bandpass filter (not illustrated) which passes wideband signals by passing signals at 10 MHz plus or minus 4 MHz, or a second bandpass filter (not illustrated) which passes narrowband signals by passing signals at 10 MHz plus or minus 0.2 MHz. A conventional first mixer 130 receives the filtered first analog intermediate frequency signal and the fourth local oscillator signal LO4, and produces a corresponding second analog intermediate frequency signal. The second analog intermediate frequency signal is filtered by a conventional bandpass filter (BPF) 132. A conventional switch 134 receives the second local oscillator signal LO2 and the third local oscillator signal LO3, and outputs one of the oscillator signals as a selected oscillator signal. A conventional second mixer 136 receives the selected oscillator signal from switch 134 and the filtered signal from BPF 132, and thereby produces a third analog intermediate frequency. Conventional switches 138 and 140 are controlled to switch the third analog intermediate frequency through either BPF 142 or BPF 144, and then to a third mixer 146, all of which are conventional units. Third mixer 146 also receives the first local oscillator signal LO1 and produces a final frequency signal. Third mixer 146 typically represents the last frequency translation of the transmitted signal. In FIG. 7, the final frequency signal produced by third mixer 146 is switched to either lowpass filter 150, 152 or 154. Conventional medium-power amplifiers 156, 158 and 160 provide power amplification of the final frequency signal.

When used in a communication, navigation or interrogation (CNI) system that requires control of an antenna interface unit, FPGA 114 provides such control signals either over transmit control bus 127 or transmit discretes such as 129a, 129b and 129c. For example, tuning data, as well as additional AIU control data received from the external controller or computer 111a is, if necessary, processed in DSP 112, reformatted in FPGA 114 and relayed to the associated AIU via transmit bus 127 for control of filters, switches, etc. Such tuning data and AIU control data can include data relating to transmit signal distribution—e.g., either from the assigned transmit module or a spare transmit module. Also, various commands to the AIU requiring a short time response are, if necessary, processed in DSP 112, reformatted in FPGA 114 and passed to the AIU via discrete lines 129a, 129b and 129c. For example, transponder top or bottom antenna selection is performed via transmit discrete 129a, transmit or receive select is performed via transmit discrete 129b. Pulse shape strobe for synchronization of modulator pulse output with additional pulse shaping (e.g., for TACAN gaussian pulses) can be performed in the AIU power amplifier.

Figure 8:
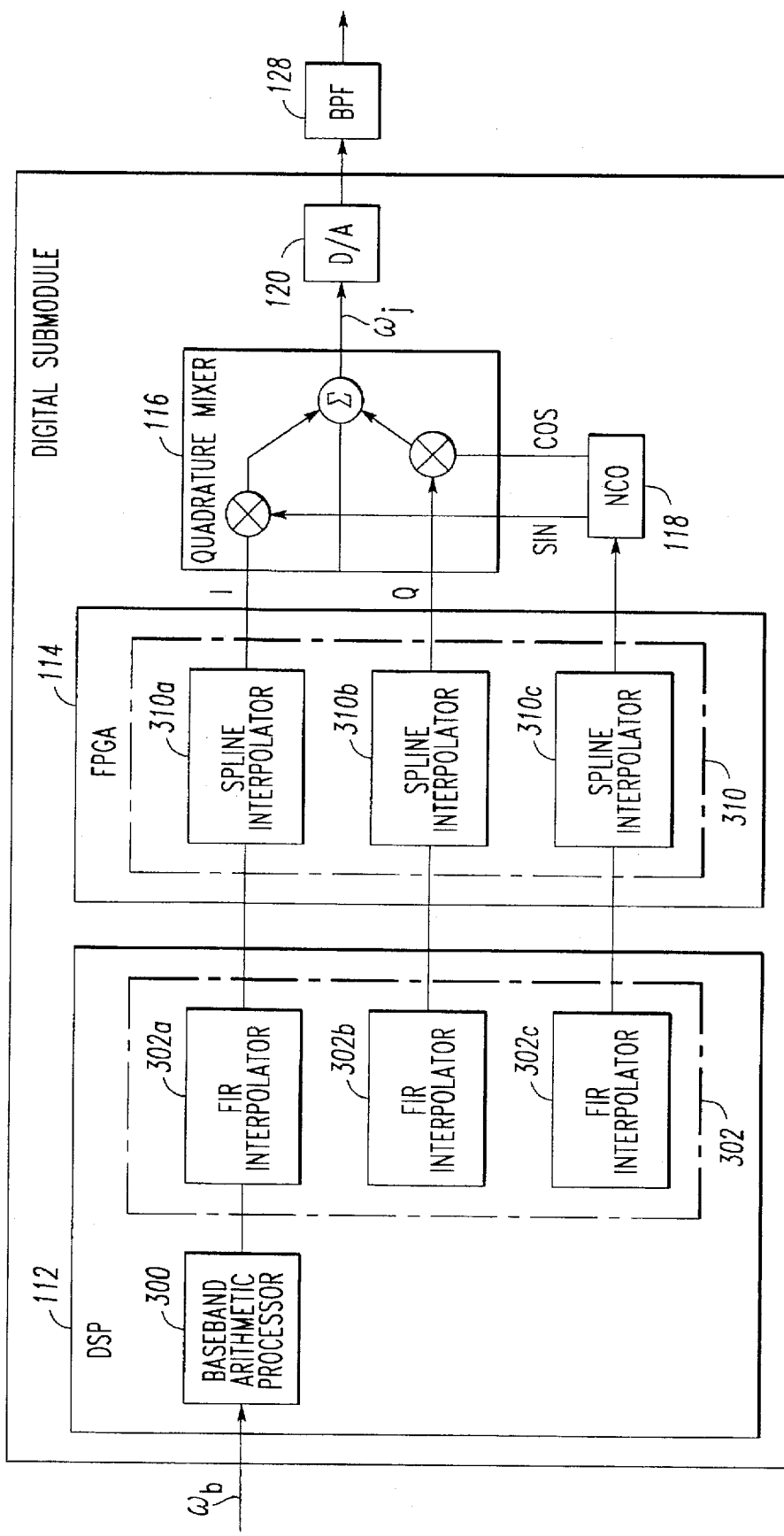
FIG. 8 is a diagram of a digital signal processor, a field programmable gate array and a quadrature mixer of a common transmit module, according to an embodiment of the present invention.

FIG. 8 is a more detailed diagram of DSP 112 and FPGA 114 in FIG. 7. As illustrated in FIG. 8, DSP 112 is programmed to operate as a baseband arithmetic processor 300 for performing baseband modulation, and a FIR interpolator 302 which may include FIR interpolators 302a, 302b and 302c for performing FIR interpolation on the in-phase signal, the quadrature signal and the frequency signal, respectively, produced by baseband arithmetic processor 300. Each interpolator 302a, 302b and 302c work in the same manner, except on different input signals. All interpolators 302a, 302b and 302c are not used in all applications. FPGA 114 is configured as a Spline interpolator 310 which includes Spline interpolators 310a, 310b and 310c. Spline interpolator 310a performs Spline interpolation on the FIR interpolated in-phase signal output by FIR interpolator 302a. Spline interpolator 310b performs Spline interpolation on the FIR interpolated quadrature signal output by FIR interpolator 302b. Similarly, Spline interpolator 310c performs Spline interpolation on the FIR interpolated frequency signal output by FIR interpolator 302c. Spline interpolators 310a, 310b and 310c work in the same manner, except on different input signals and may or may not be used in some applications. It is well-known that, depending on a particular application, interpolation is performed on some or all of the in-phase signal, the quadrature signal and the frequency signal. For example, with VHF AM transmission, interpolation is only performed on the in-phase signal. Therefore, with VHF AM transmission, DSP 112 would be programmed to function as a FIR interpolator 302 including FIR interpolator 302a, but not including FIR interpolators 302b and 302c. With VHF AM, the quadrature and frequency signals are held constant, and need not be interpolated.

In FIG. 8, the signal provided to baseband arithmetic processor 300 has an input sample rate $w_b$, the signals output by FIR interpolator 302 have a sample rate $w_f$, the signals output by Spline interpolator 310 have a sample rate of $w_i$, and the signal output by quadrature mixer 116 have a sample rate of $w_{out}$.

VHF AM TRANSMISSION BY COMMON TRANSMIT MODULE

Figure 9:
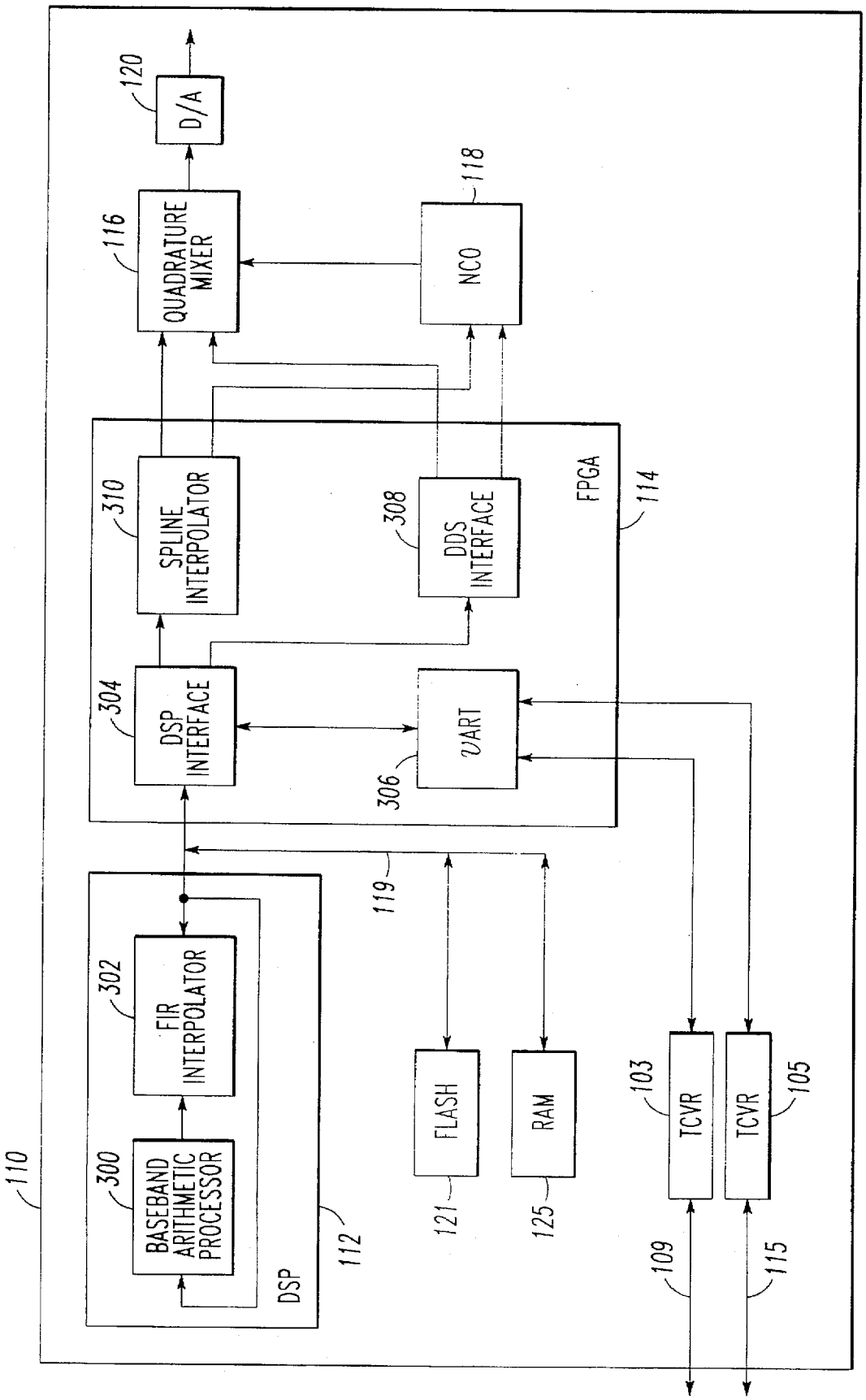
FIG. 9 is a detailed block diagram of a digital signal processor and a field programmable gate array of a common transmit module, according to an embodiment of the present invention.

FIG. 9 is a detailed block diagram of digital submodule 110 with FPGA 114 formatted for use in a conventional VHF AM system. As illustrated in FIG. 9, DSP 112 functions as a baseband arithmetic processor 300, as previously described in reference to Table II, to provide the desired arithmetic manipulation of the input data stream for VHF AM. Since VHF AM requires interpolation, DSP 112 also functions as a FIR interpolator 302, according to the zero order FIR interpolation process previously discussed. FPGA 114 performs the reconfigurable format functions of input/output (I/O) control and high speed processing. FPGA 114 is formatted to simultaneously function as (a) a DSP interface 304 to provide an interface between DSP 112 and FPGA 114 via local bus 119, (b) a serial interface 306 to provide an interface between system bus 109 and FPGA 114, (c) a direct digital synthesis (DDS) interface to provide an interface between FPGA 114 and quadrature mixer 116, and between FPGA 114 and numerically controlled oscillator 118, and (d) a Spline interpolator 310. Serial interface 306 is connected to transceiver 103. Transceiver 103 generates signals on system bus 109. Transceiver 103 also generates signals on transmit discrete 129b for interfacing with antenna interface units (AIUs) (not illustrated). Transceiver 103 generates signals on tune bus 117 for interfacing with control interface 123. Similarly, transceiver 103 generates signals on transmit control bus 127 for interfacing with AIUs.

Therefore, computer 111a transfers format codes for properly formatting FPGA 114 and a program for controlling DSP 112, into RAM 125 via system bus 109. When DSP 112 runs the computer program, DSP 112 sends the format codes from RAM 125 to FPGA 114 over local bus 119, thereby formatting FPGA 114. The computer program controls DSP 112 so that DSP functions as a conventional baseband arithmetic processor 300 to perform the required digital signal processing of an information signal for the desired type of transmission, in accordance with Table II, previously discussed. Also, DSP 112 reads frequency parameters for VHF AM stored in RAM 125. The frequency parameters are then transferred via local bus 119 to DSP interface 304, from DSP interface 304 to DDS interface 308, and from DDS interface 308 to numerically controlled oscillator 118 to initialize numerically controlled oscillator 118 to produce numerically controlled oscillations at a specific frequency in accordance with a VHF AM transmission.

Then, numerically controlled oscillator 118 functions as a digital local oscillator to produce a digital oscillation signal in accordance with the frequency parameters read from RAM 125 by DSP 112 and sent by DSP 112 to numerically controlled oscillator 118. With VHF AM, a voice signal is converted into an analog electrical signal by a microphone (not illustrated). The analog electrical signal is then digitized by sound card 111c, thereby producing a digitized voice signal on system bus 109. The digitized voice signal is transferred from sound card 111c through the serial interface 111b to serial interface 306 of FPGA 114 via system bus 109 and transceiver 103. In a conventional manner, serial interface 306 converts the digitized voice signal to an appropriate format and sends the digitized voice signal to DSP interface 304. DSP interface 304 functions as an interface with DSP 112 to send the digitized voice signal to baseband arithmetic processor 300 of DSP 112. Baseband arithmetic processor 300 then manipulates the digitized voice signal to create the modulating signal in accordance with the VHF AM requirements listed in Table II.

The digitized voice signal must also be interpolated. FIR interpolator 302 of DSP 112 interpolates an information signal with zero order hold FIR interpolation, as previously discussed, and the information signal is further interpolated with Spline interpolation by Spline interpolator 310 of FPGA 114. With VHF AM, only the in-phase signal is interpolated, as is well-known.

Therefore, after being manipulated by baseband arithmetic processor 300, the in-phase signal of the digitized voice signal is interpolated by FIR interpolator 302 of DSP 112. After interpolation, the signal is transferred back to DSP interface 304 of FPGA 114. DSP interface 304 functions as an interface between DSP 112 and FPGA 114 to send the interpolated in-phase signal to Spline interpolator 310 of FPGA 114 where the in-phase signal is further interpolated. An interpolated in-phase signal produced by interpolator 310 is provided to quadrature mixer 116. The quadrature, phase and frequency signals are not used in VHF AM.

Quadrature mixer 116 mixes the digital oscillation signal from numerically controlled oscillator 118 with the interpolated in-phase signal produced by interpolator 118, thereby producing a digitally modulated carrier signal. The digital amplitude modulated carrier signal is supplied to digital to analog converter 120. Digital to analog converter 120 receives the digitally modulated carrier signal and converts the digitally modulated carrier signal to an analog amplitude modulated carrier signal. The analog modulated carrier signal represents a first analog intermediate frequency (IF) signal and is provided to analog submodule 108. The intermediate frequency of the analog modulated carrier signal is preferably at 10 MHz. FPGA 114 also sends a control signal, via tune bus 117, to control interface 123 of analog submodule 102.

Control interface 123 controls switches 134, 138, 140 and 148 so that the analog modulated carrier signal is properly routed through analog submodule 108. Control interface 123 also commands tunable LO1 124 to the proper frequency. The first analog intermediate frequency signal produced by digital to analog converter 120, at 10 MHz, is serially transferred from digital submodule 102 and is received by BPF 128. BPF 128 passes wideband signals at 10 MHz, plus or minus 4 MHz. BPF 128 is a filter having a passband response which is sufficiently wide to pass all CNI radio functions of interest. However, for VHF AM, a BPF with a narrower passband response can be employed. After passing through BPF 128, the first intermediate frequency signal is mixed by mixer 130 with the fourth local oscillator signal LO4 (60 MHz) to produce the second analog intermediate frequency signal at approximately 70 MHz. The second intermediate frequency signal passes through BPF 132 centered at 70 MHz, and is received by second mixer 136. Since VHF AM signals must be transmitted within the frequency range of 118 MHz to 152 MHz, switch 134 is controlled to select LO2 (960 MHz). Thus, second mixer 136 mixes the second intermediate frequency signal with the second local oscillator signal LO4, to produce the third intermediate frequency signal at approximately 890 MHz. Switches 138 and 140 are controlled to allow the third intermediate frequency signal to pass through BPF 144 centered at approximately 890 MHz. After passing through BPF 144, the third intermediate frequency signal is received by third mixer 146. For RF output in the range of 88 MHz to 447 MHz, the first local oscillator signal LO1 is set in the range of 978 MHz to 1337 MHz. Therefore, third mixer 146 mixes the third intermediate frequency signal with the first local oscillator signal LO1, to produce the final upconverted signal. Then, switch 148 is controlled to allow the final upconverted signal to pass through LPF 152. LPF 152 allows signals in the range of 118 MHz to 447 MHz to pass therethrough. The signal is then routed to an AIU (not illustrated) which supports VHF AM for additional filtering and amplification. Transpond bus 115 is not used when common transmit module 102 is programmed for use in a VHF AM system.

Summary of Signal Flow for VHF AM

Figure 10:
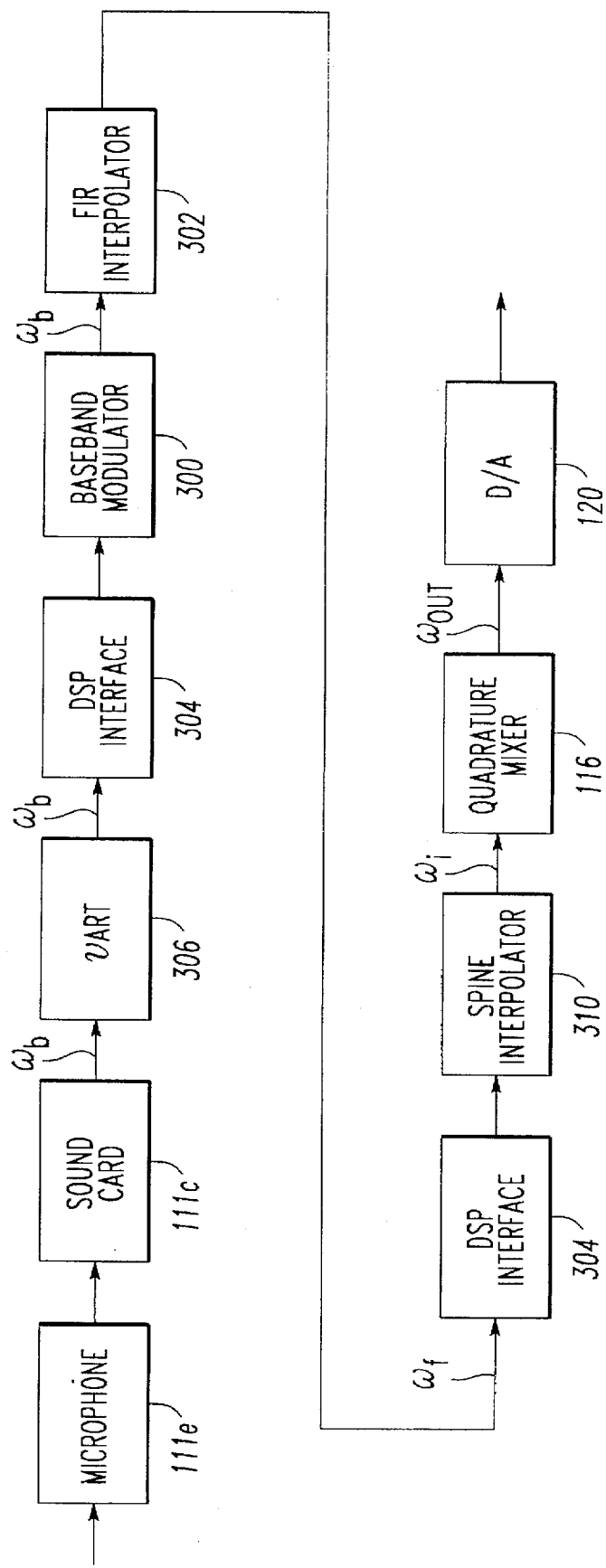
FIG. 10 is a diagram illustrating the signal flow of a common transmit module programmed for transmitting VHF AM, according to an embodiment of the present invention.

FIG. 10 illustrates a summary of the signal flow, discussed above, when common transmit module 102 is used to transmit VHF AM. A voice signal is received by a microphone 111e and converted to an electrical signal. The electrical signal is provided to sound card 111c where it is converted to a digitized voice signal. According to an embodiment of the present invention, the digitized voice signal is at an input sample rate of $w_b$. As an example, it can be assumed that the digitized voice signal has a frequency of 8 kHz. Via system bus 109, the digitized voice signal is provided to UART 306 of FPGA 114. From UART 306, the digitized voice signal travels to DSP interface 304 and then to baseband arithmetic processor 300 of DSP 112. Baseband arithmetic processor 300 performs baseband modulation and sends the signal to FIR interpolator 302 of DSP 112. The signal provided to FIR interpolator 302 still has a sample rate of $w_b$. FIR interpolator 302 then performs FIR interpolation with zero order hold, as described above, to produce a FIR filtered signal. The FIR filtered signal produced by FIR interpolator 302 has a sample rate of $w_f$, as described above. Assuming that the digitized voice signal had a frequency of 8 kHz and the FIR interpolator 302 interpolates by eight, the frequency of the FIR filtered signal will be 64 kHz. From FIR interpolator 302, the FIR filtered signal travels through DSP interface 304 to Spline interpolator 310 of FPGA 114. Spline interpolator 310 then performs Spline interpolation on the FIR filtered signal, to produce a FIR-Spline interpolated signal. The FIR-Spline interpolated signal has a sample rate of $w_j$, as described above. Assuming the Spline interpolator 310 interpolates by one-hundred-twenty-five, the FIR-Spline interpolated signal will be a digitized voice signal having a frequency of approximately 8 MHz. The FIR-Spline interpolated signal is provided to quadrature mixer 116 where the digitally modulated carrier signal is produced and then converted to an analog signal in digital to analog converter 120.

Analog Filter

Numerically controlled oscillator 118 will generate harmonics which must be suppressed by analog filtering after A/D conversion. Therefore, BPF 128 provides such filtering. A numerically controlled oscillator (such as numerically controlled oscillator 118) generating a $\cos(\omega_c t)$ carrier at an $\omega_{clk}$ sample rate will have first harmonic located at $\omega_{clk}-\omega_c$ with amplitude $-20 \cdot \log_{10}(\omega_{clk}/\omega_c-1)$. The attenuation due to analog filtering in BPF 128 will be approximately $-10 \cdot \log_{10}(1+(\omega/B_{if})^{2p})$ where $\omega$ is relative to the center frequency of BPF 128 and $B_{if}$ is the single sided bandwidth of BPF 128. Filter attenuation of BPF 128 is insignificant for $\omega \ll B_{if}$. Assuming that BPF 128 is a conventional Butterworth filter, filter attenuation of BPF 128 can be approximated by the Butterworth equation: $-20 \cdot p \cdot \log_{10}(\omega/B_{if})$ for $\omega \gg B_{if}$. Numerically controlled oscillator harmonic amplitude after analog filtering by BPF 128 is approximated by the equation below.

$$spurs_{nco} = -20 \cdot \log_{10}(\omega_{clk}/\omega_c-1) - 20 \cdot p \cdot \log_{10}((\omega_{clk}-2\omega_c)/B_{if})$$

Solving for the minimum filter order, or number of filter poles, gives $$p \geq \frac{-spurs/20 + \log_{10}(\omega_{clk}/\omega_c - 1)}{\log_{10}((\omega_{clk} - 2\omega_c)/B_{if})}$$

Interpolation

With VHF AM, interpolation is required to reduce harmonics to specified levels for voice transmission. Specifications are made at multiple frequency offsets. The first is "in-channel" harmonics or total harmonic distortion (THD). The second is "out-of-channel" harmonics or spurious signals. The table below lists those specifications considered so far.

| Function | THD | Channel Width | Interfer | Offset |
|---|---|---|---|---|
| VHF-AM | -12dB (25%) | 350–2.5kHz | -70dB | 22kHz |

As listed above for VHF-AM transmission, the maximum interference which can be transmitted under Federal Communication Commission (FCC) standards is -70 dB. Also, as listed above, the offset at which the FCC requires this interference to be measured is estimated to be approximately 22 kHz from the center frequency of the transmission. As previously described, an interpolator calculates sample estimates in between samples. In other words, for each sample input to the interpolator, $m_i > 1$ samples are output. Therefore, if the input sample rate is $\omega_b$, the output sample rate is $\omega_f = m_i \omega_b$.

Spectrum of FIR Filter portion of FIR Interpolator

Due to the limited pass band of a microphone (not illustrated) and anti-aliasing filter (not illustrated) of sound card 111c prior to analog to digital conversion, the input spectrum is attenuated for frequencies between the pass band cutoff of the FIR filter, $\omega_p$, and stop band cutoff of the FIR filter, $\omega_s \leq B_b$, where $B_b = \omega_b/2$ is the Nyquist sampling frequency. The input spectrum is assumed to attenuate linearly from 0 dB to $\Delta_{in}$ across the frequency band from $\omega_p$ to $\omega_s$. FIR filter parameters are assumed to be similar to the input spectrum parameters with the exception of a stop band attenuation of $\Delta_s$. Therefore, FIR filter output spectrum will attenuate linearly from 0 dB to $\Delta_{sin}$ across the frequency band from $\omega_p$ to $\omega_s$ where $\Delta_{sin} = \Delta_s + \Delta_{in}$.

Design Parameters

The selection of interpolation parameters involves variables that are intricately related. Ideally, the selection of parameters would be proven to minimize implementation cost. However, since ease of implementation requires that all interpolations are by an integer multiple, relatively few choices exist. That is, the FIR filter output rate of FIR interpolator 302 should be an integer multiple of the baseband input rate. The output rate of Spline interpolator 310 should be an integer multiple of the FIR filter rate. The system clock rate $\omega_{clk}$ should be an integer multiple of the spline interpolation rate. The implications are summarized below.

$\omega_f = m_f \omega_b$ $\omega_i = m_i \omega_f = m_i m_f \omega_b$ $\omega_{clk} = m_{clk} \omega_i = m_{clk} m_i m_f \omega_b$ Therefore, according to an embodiment of the present invention for VHF AM transmission, $m_{clk} m_i m_f = \omega_{clk}/\omega_b = 40$ MHz/8 kHz=2500=$2^2 5^4$. The thought process for parameter selection is shown in the next paragraphs.

1. Input Sample Rate

In the present embodiment of the present invention for VHF AM transmission, input bandwidth is limited to $B_{in}$=2.5 kHz. Also, according to the present embodiment of the present invention, a baseband sample rate of $\omega_b$=8 kHz$\geq$5 kHz=$2\omega_p$ has been selected to satisfy Nyquist sampling requirements.

2. Input Quantization

According to the present embodiment of the invention, an 8-bit (sign plus 7-bit) 2's complement representation has been selected with VHF AM transmission. The quantization noise amplitude will be $q^2/12=(2^{-7})^2/12=-52.9$ dB. If automatic gain control is performed in DSP 112 and is set control peaks to 6 dB below maximum to provide 6 dB headroom (1-bit) and if the rms waveform power is 6 dB below that, then the rms signal level will be $-12$ dB. Therefore, the resulting signal to input quantization noise level will be 40.9 dB.

3. Output Spur Level

To maintain spur levels at the antenna (not illustrated) less than $-60$ dB as required by some waveforms, the output of quadrature mixer 116 must have spur levels less than $-70$ dB. This implies the output of FIR interpolator 302 must also have spur levels of $\Delta_{sin} = -70$ dB.

4. Analog IF Filter

The bandwidth of BPF 128 must be wide enough to pass the maximum signal bandwidth of $B_{if}$=4 MHz. The IF carrier is preferably centered at $\omega_c$=10 MHz and is preferably generated with $\omega_{clk}$=40 MHz samples. Then, the minimum filter order is $$p \geq \left\lceil \frac{70/20 + \log_{10}(40/10 - 1)}{\log_{10}((40 - 2 \cdot 10)/4)} \right\rceil = \lceil 4.3 \rceil = 5.$$

According to the present embodiment of the present invention for VHF AM transmission, an 8-pole Butterworth filter having performance comparable to an ideal 6-pole Butterworth filter has been selected for use as BPF 128.

5. Interpolation Rate

The interpolation rate required to limit sampling harmonics to specified levels is $\omega_i \geq 4.41$ MHz, as below:

$$\omega_i \geq \begin{cases} 10^{\wedge}\left(\frac{70/20 + \log_{10}(2.5e3) + 6 \cdot \log_{10}(4e6)}{6+1}\right) 2.5e3 = 4.41e6 & \omega_0 = \omega_p = 2.5e3 \\ 10^{\wedge}\left(\frac{\frac{-70+70}{20} + \log_{10}(4e3) + 6 \cdot \log_{10}(4e6)}{6+1}\right) 4e3 = 1.49e6 & \omega_0 = B_b = 4e3 \end{cases}$$

Therefore, select $\omega_i$=5 MHz, thereby implying $m_{clk} = \omega_{clk}/\omega_i = 40$ MHz/5 MHz=$2^3$=8.

Local maxima may occur at some $\omega_o$ in between endpoints $\omega_p$ and $\omega_s$. It is possible to take the derivative with respect to $\omega_o$ and solve for where the local maxima occurs. Alternatively, the bound for $\omega_i$ can be plotted and the maxima determined by inspection.

6. Interpolation Method

The least expensive interpolation method investigated is a FIR interpolator with a FIR filter, followed by a quadratic spline interpolator. It may be possible to reduce interpolation work by using a cubic spline. The cubic spline additionally estimates the third derivative of the input sequence. If quantization noise is small enough, the third derivative can be estimated precisely enough for use with the cubic spline. Experience has shown that spline interpolation with order higher than three is impractical.

7. Spline interpolation

The input data rate to Spline interpolator 310 required to achieve spline spurs $\leq -70$ dB with a quadratic spline (order=2) for a fundamental at $\omega_i$=39.2 kHz is determined below.

$$\omega_f \geq \begin{cases} (10^{-70/60} + 1)2.5e3 = 39.2 \text{ kHz} & \omega_0 = \omega_p = 2.5e3 \\ (10^{\frac{-70+70}{60}} + 1)4e3 = 8 \text{ kHz} & \omega_0 = B_b/2 \end{cases}$$

Therefore, select $\omega_f$=40 kHz, thereby implying $m_i = \omega_i/\omega_f = 5$ MHz/40 kHz=$5^3$=125 and $m_f = \omega_f/\omega_b$=40 kHz/8 kHz=5.

8. FIR Filter

FIR filter parameters for FIR interpolator 302 should be chosen to minimizing work subject to meeting requirements. FIR work is inversely related to transition band width $B_t$ of the FIR filter. Therefore, maximize $B_t$ by selecting $\omega_p$=2.5 kHz and $\omega_s = \omega_b/2 = 4$ kHz yielding $B_t = (4.0 - 1.5)/40 = 0.0375$. Since the input spectrum attenuates by $\Delta_{in} = -30$ dB, the FIR filter must attenuate by $\Delta_s = \Delta_{sin} - \Delta_{in} \leq -40$ dB. The number of taps required for $\Delta_p$=1 dB pass band ripple is approximately $-\Delta_s/(16.6 \cdot B_t) = 40/(16.6 \cdot 0.0375) = 64.3 \approx 13 \cdot 5 + 1 = 66$. The work required to implement the FIR filter is approximately $2 \cdot \lceil (\text{taps}-1)/m_f \rceil \cdot \omega_f = 2 \cdot \lceil (66-1)/5 \rceil \cdot 40$ k==1.04 MFLOPS.

9. Spline Adder Parameters

Spline interpolator 22 has two adders 60 and 62 (see FIG. 4). Therefore, the precision of adders 60 and 62 is determined as follows. The precision needed at the modulator I and Q inputs to achieve $-70$ dB spurs is $\lceil -70 \text{ dB}/(-6 \text{ dB/bit})\rceil = 12$-bits or sign plus 11-bits which implies $q_{iq}=2^{-11}$. Thus interpolation quantization parameters are $q_f \leq q_{iq}/m_f = 2^{-11}/125 = 2^{-18}$ and $q_{df} \leq 2q_{iq}/m_i^2 = 2 \cdot 2^{-11}/125^2 = 2^{-24}$. The width of the argument df(x) must support $dV=2\pi \cdot 5e3/5e6 = 0.010 = 2^{-6.64} \leq 2^{-7}$. Therefore, the bits from the $2^{-6}$ position and up of df(x) are sign. The width of the argument ddf must support $dV = 4\pi^2 5e3^2/5e6^2 = 39.5e-6 = 2^{-14.6} \leq 2^{-14}$. Therefore, the bits from the $2^{-13}$ position and up of ddf are sign.

| IQ bits | f bits | f adder full/half bits | df bits | df adder full/half bits | ddf bits |
|---|---|---|---|---|---|
| 12 | 19 | 12/7 | 19 | 12/7 | 12 |

Although a few preferred embodiments of the invention have been shown and described, it will be appreciated by those skilled in the art that changes may be made in these embodiments, without departing from the principles and the spirit of the invention. The scope of the embodiments is defined in the claims and their equivalents. Moreover, the present invention is not intended to be limited to the specific frequencies and parameters presented herein.

| S | $2^4$ | ... | $2^4$ | $2^{-7}$ | ... | $2^{-11}$ | $2^{-12}$ | ... | $2^{-13}$ | $2^{-14}$ | ... | $2^{-18}$ | $2^{-19}$ | ... | $2^{-21}$ |
|---|---|---|---|---|---|---|---|---|---|---|---|---|---|---|---|
| IQ | s | x | x | x | x | x | x | | | | | | | | | |
| f  | s | x | x | x | x | x | x | x | x | x | x | x | x | | | |
| df | s | s | s | s | x | x | x | x | x | x | x | x | x | x | x | x |
| d²f| | | s | s | s | s | s | s | s | s | x | x | x | x | x | x |

10. Parameters Summary

According to the present invention, a combination of FIR interpolation by DSP 112 and Spline interpolation by FPGA 114 maximizes use of digital submodule 110. DSP 112 interpolates by a factor of x using a FIR filter approach with zero order hold. FPGA 114 then interpolates with a spline interpolator by a factor of y to achieve a total interpolation factor of m=x*y.

The following is a parameter summary of the various parameters selected for the transmission of VHF AM with a combination FIR-Spline interpolation performed by common transmit module 102, according to the present invention. The parameters disclosed herein are only intended to represent an example of parameters for VHF AM transmission and the present invention is not intended to be limited by the following parameters.

| $q_{in}$ (bits) | S/N$_{quant}$ (dB) | B$_{if}$ (SSB) MHz | p |
|---|---|---|---|
| 8 ($2^{-7}$ res) | 40.9 | 4 | 6 |

| $m_f$ | $m_i$ | $m_{clk}$ | $\omega_b$ kHz | $\omega_f$ kHz | $\omega_i$ MHz | $\omega_{clk}$ MHz |
|---|---|---|---|---|---|---|
| 5 | 125 | 8 | 8 | 40 | 5 | 40 |

| $\Delta_{sin}$ dB | $\Delta_{in}$ dB | $\Delta_s$ dB | $\Delta_p$ dB | $\omega_p$ kHz | $\omega_s$ kHz | FIR taps | work MFLOPS |
|---|---|---|---|---|---|---|---|
| 70 | 30 | 40 | 1 | 2.5 | 4 | 66 | 1.04 |

Proofs

1. The following are proofs of equations used herein for determining parabolic interpolation.

Theorem

The coefficients for the parabola $f(x)=ax^2+bx+c$ that interpolate from the point $(x_1,y_1)$ to the point $(x_2,y_2)$ with $y_1'$ slope at $(x_1,y_1)$ are $$a = \frac{(y_2 - y_1) - y_1'(x_2 - x_1)}{(x_2 - x_1)^2}$$

Proof

The coefficients must satisfy the three equations below.

$$y_1 = ax_1^2 + bx_1 + c \qquad \text{eq1}$$

$$y_2 = ax_2^2 + bx_2 + c \qquad \text{eq1}$$

$$y_1' = 2ax_1 + b \qquad \text{eq3}$$

Solving for the coefficients using matrix notation gives the following.

$$\begin{bmatrix} y_1 \\ y_2 \\ y_1' \end{bmatrix} = \begin{bmatrix} x_1^2 & x_1 & 1 \\ x_2^2 & x_2 & 1 \\ 2x_1 & b & 0 \end{bmatrix} \begin{bmatrix} a \\ b \\ c \end{bmatrix}$$

$$\Rightarrow \begin{bmatrix} a \\ b \\ c \end{bmatrix} = \frac{1}{(x_2 - x_1)^2} \begin{bmatrix} -1 & 1 & x_1 - x_2 \\ 2x_1 & -2x_1 & -x_1^2 + x_2^2 \\ x_2^2 - 2x_1x_2 & x_1^2 & x_1^2 x_2 - x_2^2 x_1 \end{bmatrix} \begin{bmatrix} y_1 \\ y_2 \\ y_1' \end{bmatrix}$$

$$= \frac{1}{(x_2-x_1)^2} \begin{bmatrix} (y_2-y_1)-y_1'(x_1-x_2) \\ 2x_1(y_2-y_1)-y_1'(x_2^2-x_1^2) \\ (x_2^2-2x_1x_2)y_1+x_1^2y_2+(x_1^2x_2-x_2^2x_1)y_1' \end{bmatrix}$$

The simplest coefficient equations can be found by first using the top line of the matrix above for a, then solving eq3 for b and eq1 for c.

Theorem

Interpolating by a factor of $m_i$ between two samples $y_1$ and $y_2$ with initial slope $y_1'$ can be accomplished with $$f(0)=c$$

$$df(0)=b+a$$

$$ddf(\ )=2a$$

$$f(x)=f(x-1)+df(x-1) \quad x=1,\ldots,m_i-1$$

$$df(x)=df(x-1)+ddf(\ ) \quad x=1,\ldots,m_i-1$$

where $$a=((y_2-y_1)-y_1'm_i)/m_i^2$$

$$b=y_1'$$

$$c=y_1$$

$$y_2'=2am_i+b(=\text{next } y_1')$$

Proof

Interpolation by a factor of $m_i$ implies $x_1=0$ and $x_2=m$. Substituting these values for $x_1$ and $x_2$ in the general equations for a, b, and c give the results above. The interpolation equation $f(x)$ must be evaluated at $x=0,\ldots,m-1$. The evaluation of $f(x)$ can be simplified by using knowledge of $f(x-1)$ as shown below.

$$f(x-1)=a(x-1)^2+b(x-1)+c=ax^2+bx+c-2ax+a-b=f(x)-2ax+(a-b)$$
$$\rightarrow f(x)=f(x-1)+2ax+(b-a)$$

To simplify evaluation further, define $df(x-1)=2ax+(b-a)$. Now the evaluation of $df(x-1)$ can also be simplified by knowledge of $df(x-2)$.

$$df(x-2)=2a(x-1)+(b-a)=2ax+(b-a)-2a=df(x-1)-2a \rightarrow df(x-1)=df(x-2)+2a \rightarrow df(x)=df(x-1)+2a$$

Theorem

The error after $m_i$ iterations of $f(x)=f(x-1)+df(x-1)$ with fixed point $q_f$ quanta precision and $df(x)=df(x-1)+ddf$ with $q_{df}$ quanta precision is bounded by $m_iq_f/2+m_iq_{df}/4$.

Proof

The error for an addition operation is bounded by ½ quanta of the arguments.

$$\begin{aligned} f(x) &= f(x-1)+df(x-1) \\ &= f(0)+\sum_{i=0}^{x-1}(df(i)+q_f/2) \\ &= f(0)+\sum_{i=0}^{x-1}(2ai+(b+a)+iq_{df}/2+q_f/2) \\ &= ax^2+bx+c+xq_f/2+x^2q_{df}/4-xq_{df}/4 \end{aligned}$$

$$\begin{aligned} df(x) &= df(x-1)+ddf(0) \\ &= df(0)+\sum_{i=0}^{x-1}(ddf(0)+q_{df}/2) \\ &= df(0)+ddf(0)x+xq_{df}/2 \\ &= 2ax+(b+a)+xq_{df}/2 \end{aligned}$$

The error portion of the summation for $x=m_i-1$ is error $\leq (m_i-1)q_f/2+(m_i^2-3m_i+2)q_{df}/4$ which is approximately the bound in the statement of the theorem.

What is claimed is:

1. A method of interpolating an input stream of original samples, comprising:

FIR filtering the input stream $m_f$ times for each original sample, each time using a different set of $m_f$ sets of coefficients satisfying the following equations:

for $l=0,1,\ldots,m_f-1$, $$C_{kl} = \begin{cases} \sum_{j=0}^{l\%m_f} c_j & k=0 \\ \sum_{j=l\%m_f+(k-1)m_f+1}^{l\%m_f+km_f} c_j & 1 \leq k \leq n-1, \text{ then} \\ \sum_{j=l\%m_f+(n-1)m_f}^{nm_f} c_j & k=n \end{cases}$$

$$xf_i = \sum_{k=0}^{n} c_{kl} x b_{\left\lfloor \frac{i}{m_f} \right\rfloor - k} \quad \text{where } l = i\%m_f$$

where % represents the modulus operator, $xf_i$ equals an output sequence of the FIR filtering step and is described mathematically in terms of a baseband input sequence $xb_i$ and the coefficients $c_{kl}$, and $m_f$ equals an interpolation factor, thereby producing an increased sample rate stream having $m_f$ output samples for each original sample of the input stream.

2. The method of interpolating of claim 1, further comprising the step of:

spline interpolating the increased sample rate stream after the increased sample rate stream is FIR filtered.

3. The method of claim 2, wherein the step of spline interpolating produces a stream of estimated samples by interpolating from one to $m_i$ samples, $f(\ )$ represents a respective estimated sample, $df(\ )$ represents a difference between a respective estimated sample and the previous estimated sample, and $ddf(\ )$ represents a difference between a respective $df(\ )$ and the previous $df(\ )$, the step of spline interpolating comprising:

determining $f(x)$ as $f(x)=f(x-1)+df(x-1)$; and determining $df(x)$ as $df(x)=df(x-1)+ddf(\ )$, where $x=1,\ldots m_i$.

4. A method of interpolating an input stream of original samples, comprising:

FIR filtering the input stream $m_f$ times for each original sample, each time using a different set of $m_f$ sets of coefficients satisfying the following equations:

for l=0, 1, . . . , $m_f$-1, $$c_{kl} = \begin{cases} \sum_{j=0}^{l\%m_f} c_j & k=0 \\ \sum_{j=l\%m_f+(k-1)m_f+1}^{l\%m_f+km_f} c_j & 1 \leq k \leq n-1, \text{ then} \\ \sum_{j=l\%m_f+(n-1)m_f}^{nm_f} c_j & k=n \end{cases}$$

$$xf_i = \sum_{k=0}^{n} c_{kl} xb_{\lfloor \frac{i}{m_f} \rfloor - k} \text{ where } l = i\%m_f$$

where % represents the modulus operator, $xf_i$ equals an output sequence of the FIR filtering step and is described mathematically in terms of a baseband input sequence $xb_i$ and the coefficients $c_{kl}$, and $m_f$ equals an interpolation factor, thereby producing an increased sample rate stream having $m_f$ output samples for each original sample of the input stream; and spline interpolating the increased sample rate stream after the increased sample rate stream is FIR filtered.

5. The method of claim 4, wherein the step of spline interpolating produces a stream of estimated samples by interpolating from one to $m_i$ samples f( ) represents a respective estimated sample, df( ) represents a difference between a respective estimated sample and the previous estimated sample, and ddf( ) represents a difference between a respective df( ) and the previous df( ), the step of spline interpolating comprising:

determining f(x) as f(x)=f(x−1)+df(x−1); and determining df(x) as df(x)=df(x−1)+ddf( ), where x=1, . . . $m_i$.

6. A method of interpolating an input stream of original samples, comprising:

increasing a sample rate of the input stream by inserting new samples in-between the original samples to produce an increased sample rate stream, the new samples being inserted at an amplitude of an immediately preceding original sample; and FIR filtering the increased sample rate stream, where the steps of increasing the sample rate and FIR filtering are combined by filtering the input stream $m_f$ times for each original sample, each time using a different set of $m_f$ sets of coefficients satisfying the following equations:

for l=0, 1, . . . $m_f$-1, $$c_{kl} = \begin{cases} \sum_{j=0}^{l\%m_f} c_j & k=0 \\ \sum_{j=l\%m_f+(k-1)m_f+1}^{l\%m_f+km_f} c_j & 1 \leq k \leq n-1, \text{ then} \\ \sum_{j=l\%m_f+(n-1)m_f}^{nm_f} c_j & k=n \end{cases}$$

$$xf_i = \sum_{k=0}^{n} c_{kl} xb_{\lfloor \frac{i}{m_f} \rfloor - k} \text{ where } l = i\%m_f$$

where % represents the modulus operator, $xf_i$ equals an output sequence of the filtering and is described mathematically in terms of a baseband input sequence $xb_i$ and coefficients $c_{kl}$, and $m_f$ equals an interpolation factor, thereby producing the increased sample rate stream having $m_f$ output samples for each original sample of the input stream.

7. The method of interpolating of claim 6, further comprising the step of:

spline interpolating the increased sample rate stream after the increased sample rate stream is filtered.

8. A method of interpolating an input stream of original samples, comprising:

increasing a sample rate of the input stream by inserting new samples in-between the original samples to produce an increased sample rate stream, the new samples being inserted at an amplitude of an immediately preceding original sample;

FIR filtering the increased sample rate stream to produce a FIR filtered signal; and spline interpolating the FIR filtered signal.

9. A method of radio transmitting an input stream of original samples which represent digitized data, the method comprising:

FIR filtering the input stream $m_f$ times for each original sample, each time using a different set of $m_f$ sets of coefficients satisfying the following equations:

for l=0, 1, . . . , $m_f$-1, $$c_{kl} = \begin{cases} \sum_{j=0}^{l\%m_f} c_j & k=0 \\ \sum_{j=l\%m_f+(k-1)m_f+1}^{l\%m_f+km_f} c_j & 1 \leq k \leq n-1, \text{ then} \\ \sum_{j=l\%m_f+(n-1)m_f}^{nm_f} c_j & k=n \end{cases}$$

$$xf_i = \sum_{k=0}^{n} c_{kl} xb_{\lfloor \frac{i}{m_f} \rfloor - k} \text{ where } l = i\%m_f$$

where % represents the modulus operator, $xf_i$ equals an output sequence of the FIR filtering step and is described mathematically in terms of a baseband input sequence $xb_i$ and coefficients $c_{kl}$, and $m_f$ equals the interpolation factor, thereby producing a FIR filtered signal having an increased sample rate stream with $m_f$ output samples for each original sample of the input stream; and mixing the FIR filtered signal with digital oscillation signals to produce a digitally modulated carrier signal.

10. The method of claim 9, further comprising the step of:

spline interpolating the FIR filtered signal before the FIR filtered signal is mixed in the mixing step.

11. The method of claim 10, wherein the step of spline interpolating produces a stream of estimated samples by interpolating from one to $m_i$ samples, f( ) represents a respective estimated sample, df( ) represents a difference between a respective estimated sample and the previous estimated sample, and ddf( ) represents a difference between a respective df( ) and the previous df( ), the step of spline interpolating comprising:

determining f(x) as f(x)=f(x−1)+df(x−1); and determining df(x) as df(x)=df(x−1)+ddf( ), where x=1, . . . $m_i$.

12. A method of radio transmitting an input stream of original samples which represent digitized data, the method comprising:

increasing a sample rate of the input stream by inserting new samples in-between the original samples to produce an increased sample rate stream, the new samples being inserted at an amplitude of an immediately preceding original sample;

FIR filtering the increased sample rate stream, where the steps of increasing the sample rate and FIR filtering are combined by filtering the input stream $m_f$ times for each original sample, each time using a different set of $m_f$ sets of coefficients satisfying the following equations:

for $l=0, 1, \ldots, m_f-1$, $$c_{kl} = \begin{cases} \sum_{j=0}^{l \% m_f} c_j & k=0 \\ \sum_{j=l \% m_f + (k-1)m_f + 1}^{l \% m_f + km_f} c_j & 1 \leq k \leq n-1, \text{ then} \\ \sum_{j=l \% m_f + (n-1)m_f}^{nm_f} c_j & k=n \end{cases}$$

$$xf_i = \sum_{k=0}^{n} c_{kl} xb_{\lfloor \frac{i}{m_f} \rfloor - k} \text{ where } l = i \% m_f$$

where % represents the modulus operator, $xf_i$ equals an output sequence of the filtering and is described mathematically in terms of a baseband input sequence $xb_i$ and coefficients $c_{kl}$, and $m_f$ equals an interpolation factor, thereby producing a FIR filtered signal having the increased sample rate stream with $m_f$ output samples for each original sample of the input stream; and mixing the FIR filtered signal with digital oscillation signals to produce a digitally modulated carrier signal.

13. The method of claim 12, further comprising the step of:

spline interpolating the FIR filtered signal before the FIR filtered signal is mixed in the mixing step.

14. A method of radio transmitting an input stream of original samples which represent digitized data, the method comprising:

increasing the sample rate of the input stream by inserting new samples in-between the original samples to produce an increased sample rate stream, the new samples being inserted at an amplitude of an immediately preceding original sample;

FIR filtering the increased sample rate stream to produce a FIR filtered signal;

spline interpolating the FIR filtered signal to produce a FIR-spline interpolated signal; and mixing the FIR-spline interpolated signal with digital oscillation signals to produce a digitally modulated carrier signal.

15. A radio transmitter which transmits an input stream of original samples representing digitized data, the radio transmitter comprising:

a digital signal processor for increasing the sample rate of the input stream by inserting new samples in-between the original samples to produce an increased sample rate stream, the new samples being inserted at an amplitude of the immediately preceding original sample, and for FIR filtering the increased sample rate stream to produce a FIR filtered signal;

a spline interpolator, connected to said digital signal processor, for receiving the FIR filtered signal and producing a FIR-spline interpolated signal; and a modulator for receiving the FIR-spline interpolated signal and producing a digitally modulated carrier signal.

16. The radio transmitter of claim 15, wherein said digital signal processor combines increasing the sample rate and the FIR filtering by filtering the input stream $m_f$ times for each original sample, each time using a different set of $m_f$ sets of coefficients satisfying the following equations:

for $l=0, 1, \ldots, m_f-1$, $$c_{kl} = \begin{cases} \sum_{j=0}^{l \% m_f} c_j & k=0 \\ \sum_{j=l \% m_f + (k-1)m_f + 1}^{l \% m_f + km_f} c_j & 1 \leq k \leq n-1, \text{ then} \\ \sum_{j=l \% m_f + (n-1)m_f}^{nm_f} c_j & k=n \end{cases}$$

$$xf_i = \sum_{k=0}^{n} c_{kl} xb_{\lfloor \frac{i}{m_f} \rfloor - k} \text{ where } l = i \% m_f$$

where % represents the modulus operator, $xf_i$ equals an output sequence of the filtering and is described mathematically in terms of a baseband input sequence $xb_i$ and coefficients $c_{kl}$, and $m_f$ equals an interpolation factor, thereby producing the increased sample rate stream having $m_f$ output samples for each original sample of the input stream.

17. The radio transmitter of claim 16, wherein said spline interpolator is a quadratic spline interpolator.

18. The radio transmitter of claim 16, wherein said spline interpolator is implemented in a field programmable gate array.

19. The radio transmitter of claim 15, wherein said spline interpolator is a quadratic spline interpolator.

20. The radio transmitter of claim 15, wherein said spline interpolator produces a stream of estimated samples by interpolating from one to $m_i$ samples, f( ) represents a respective estimated sample, df( ) represents a difference between a respective estimated sample and the previous estimated sample, and ddf( ) represents a difference between a respective df( ) and the previous df( ), said spline interpolator comprising:

means for determining f(x) as f(x)=f(x−1)+df(x−1); and means for determining df(x) as df(x)=df(x−1)+ddf( ), where x=1, ... $m_i$.

21. The radio transmitter of claim 15, wherein said spline interpolator is implemented in a field programmable gate array.

* * * * *